US012787280B2

(12) United States Patent
Lee et al.

(10) Patent No.: US 12,787,280 B2
(45) Date of Patent: Nov. 3, 2026

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Bongyong Lee, Suwon-si (KR); Yukio Hayakawa, Seongnam-si (KR); Taeyoung Kim, Seoul (KR); Hyunmog Park, Seoul (KR); Siyeon Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 645 days.

(21) Appl. No.: 18/095,576

(22) Filed: Jan. 11, 2023

(65) Prior Publication Data

US 2023/0269941 A1 Aug. 24, 2023

(30) Foreign Application Priority Data

Feb. 21, 2022 (KR) ........................ 10-2022-0022518
Mar. 22, 2022 (KR) ........................ 10-2022-0035151

(51) Int. Cl.
*H10B 43/27* (2023.01)
*G11C 16/14* (2006.01)
(Continued)

(52) U.S. Cl.
CPC ............. *H10B 43/27* (2023.02); *G11C 16/14* (2013.01); *H10B 41/10* (2023.02); *H10B 41/27* (2023.02);
(Continued)

(58) Field of Classification Search
CPC ........ H10B 43/27; H10B 41/10; H10B 41/27; H10B 41/35; H10B 43/10; H10B 43/35; G11C 16/14
See application file for complete search history.

(56) References Cited

U.S. PATENT DOCUMENTS 11,139,401 B2 10/2021 Doyle et al.
2010/0140684 A1* 6/2010 Ozawa .................. H10B 43/27 257/E21.21
(Continued)

FOREIGN PATENT DOCUMENTS

KR 102142268 B1 8/2020
KR 10-2021-0083806 A 7/2021
(Continued)

*Primary Examiner* — Jay C Kim
*Assistant Examiner* — Woo K Lee
(74) *Attorney, Agent, or Firm* — Wolf, Greenfield & Sacks, P.C.

(57) ABSTRACT

A semiconductor device includes a source structure, gate electrodes spaced apart from each other and stacked in a first direction, perpendicular to an upper surface of the source structure, and a channel structure extending through the gate electrodes in the first direction, and including a dielectric layer, a charge storage layer, a tunneling layer, a channel layer, and a buried semiconductor layer. The dielectric layer is between the gate electrodes and the charge storage layer. The tunneling layer is between charge storage layer and the channel layer. The channel layer is between the tunneling layer and the buried semiconductor layer. An outer surface of a lower portion of the channel layer is in contact with the source structure, and the dielectric layer includes a ferroelectric material, the channel layer includes an oxide semiconductor material, and the buried semiconductor layer includes silicon (Si).

19 Claims, 22 Drawing Sheets

A

(51) Int. Cl.

| | |
|---|---|
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/35*** | (2023.01) |

(52) U.S. Cl.

CPC ............. *H10B 41/35* (2023.02); *H10B 43/10* (2023.02); *H10B 43/35* (2023.02)

(56) References Cited

U.S. PATENT DOCUMENTS

| | | | | |
|---|---|---|---|---|
| 2018/0006052 | A1* | 1/2018 | Hwang .................. | H10B 43/27 |
| 2019/0393353 | A1 | 12/2019 | Jeong et al. | |
| 2020/0212060 | A1* | 7/2020 | Yoo ........................ | H10D 62/82 |
| 2020/0328229 | A1* | 10/2020 | Kim ....................... | H10B 41/27 |
| 2020/0357808 | A1* | 11/2020 | Ichinose ................ | H10B 43/50 |
| 2021/0066348 | A1 | 3/2021 | Prasad et al. | |
| 2021/0313439 | A1 | 10/2021 | Lee et al. | |
| 2022/0157833 | A1 | 5/2022 | Kobayashi et al. | |

FOREIGN PATENT DOCUMENTS

| | | | |
|---|---|---|---|
| KR | 102283203 | B1 | 7/2021 |
| KR | 10-2021-0152378 | A | 12/2021 |
| WO | 2021024598 | A1 | 2/2021 |

* cited by examiner

SEMICONDUCTOR DEVICES AND DATA STORAGE SYSTEMS INCLUDING THE SAME

CROSS-REFERENCE TO RELATED APPLICATIONS

This application claims the benefit under 35 USC § 119(a) of Korean Patent Application No. 10-2022-0022518 filed on Feb. 21, 2022, and of Korean Patent Application No. 10-2022-0035151 filed on Mar. 22, 2022, in the Korean Intellectual Property Office, the entire disclosures of which are incorporated by reference herein for all purposes.

BACKGROUND

The present disclosure relates to semiconductor devices and data storage systems including the same. Demand has increased for semiconductor devices that are capable of storing high-capacity data in a data storage system. Accordingly, a method for increasing the data storage capacity of a semiconductor device is being researched. For example, to increase the data storage capacity of a semiconductor device, a semiconductor device including memory cells arranged three-dimensionally instead of memory cells arranged two-dimensionally has been proposed.

SUMMARY

Example embodiments provide a semiconductor device having improved integration and electrical characteristics.

Example embodiments provide a data storage system including a semiconductor device with improved integration and electrical characteristics.

According to example embodiments, a semiconductor device includes a source structure, gate electrodes spaced apart from each other and stacked in a first direction, perpendicular to an upper surface of the source structure, and a channel structure extending through the gate electrodes in the first direction, and including a dielectric layer, a charge storage layer, a tunneling layer, a channel layer, and a buried semiconductor layer. The dielectric layer may be between the gate electrodes and the charge storage layer. The tunneling layer may be between charge storage layer and the channel layer. The channel layer may be between the tunneling layer and the buried semiconductor layer. An outer surface of a lower portion of the channel layer is in contact with the source structure, the dielectric layer includes a ferroelectric material, the channel layer includes an oxide semiconductor material, and the buried semiconductor layer includes silicon (Si).

According to example embodiments, a semiconductor device includes a source structure including a conductive plate layer and a source layer including a semiconductor material on the conductive plate layer, gate electrodes spaced apart from each other and stacked in a first direction, perpendicular to an upper surface of the source structure, and a channel structure extending through the gate electrodes in the first direction, and including a dielectric layer, a charge storage layer, a tunneling layer, a channel layer, and a buried semiconductor layer. The dielectric layer may be between the gate electrodes and the charge storage layer. The tunneling layer may be between charge storage layer and the channel layer. The channel layer may be between the tunneling layer and the buried semiconductor layer. The channel structure has a contact region in which the dielectric layer, the charge storage layer and the tunneling layer are absent in a lower portion of the channel structure, and an outer surface of the channel layer is in contact with the source layer in the contact region, and the channel layer includes an oxide semiconductor material.

According to example embodiments, a data storage system includes a semiconductor storage device including a source structure, circuit elements on a side of the source structure, and an input/output pad electrically connected to the circuit elements, and a controller electrically connected to the semiconductor storage device through the input/output pad and configured to control the semiconductor storage device. The semiconductor storage device further includes gate electrodes spaced apart from each other and stacked in a first direction, perpendicular to an upper surface of the source structure, and a channel structure extending through the gate electrodes in the first direction, and including a dielectric layer, a charge storage layer, a tunneling layer, a channel layer, and a buried semiconductor layer. The dielectric layer may be between the gate electrodes and the charge storage layer. The tunneling layer may be between charge storage layer and the channel layer. The channel layer may be between the tunneling layer and the buried semiconductor layer. The channel layer includes an oxide semiconductor material. The source structure may be configured to have an erase voltage applied therethrough. After the erase voltage reaches a target voltage level during an erase operation, the source structure may be configured to have a step voltage applied therethrough such that the erase voltage has a voltage higher than the target voltage level.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various embodiments will be described in detail with reference to the accompanying drawings.

Figure 1:
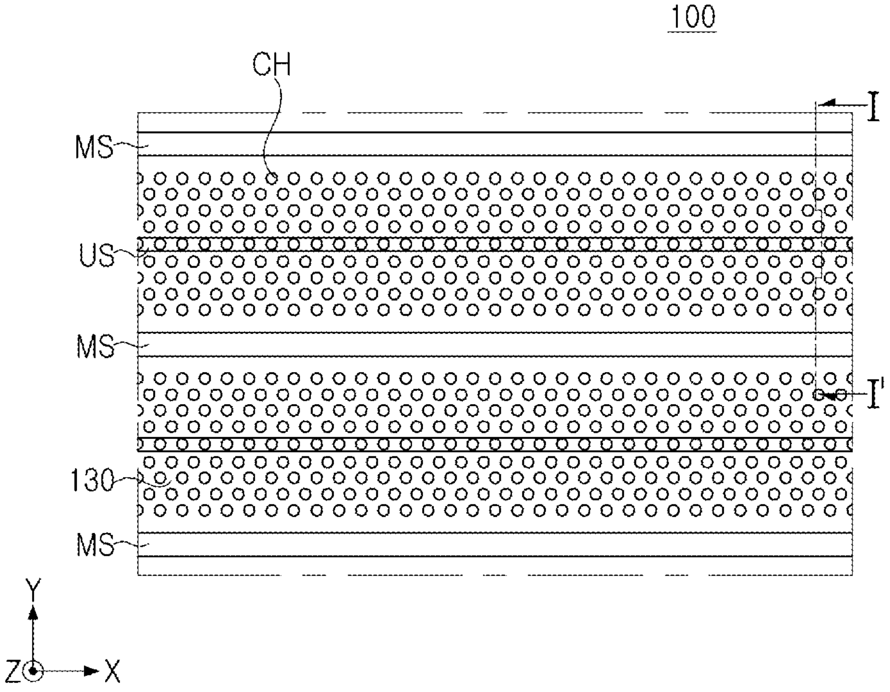
FIG. 1 is a schematic plan view of a semiconductor device according to example embodiments.

FIG. 1 is a schematic plan view of a semiconductor device according to example embodiments.

Figure 2:
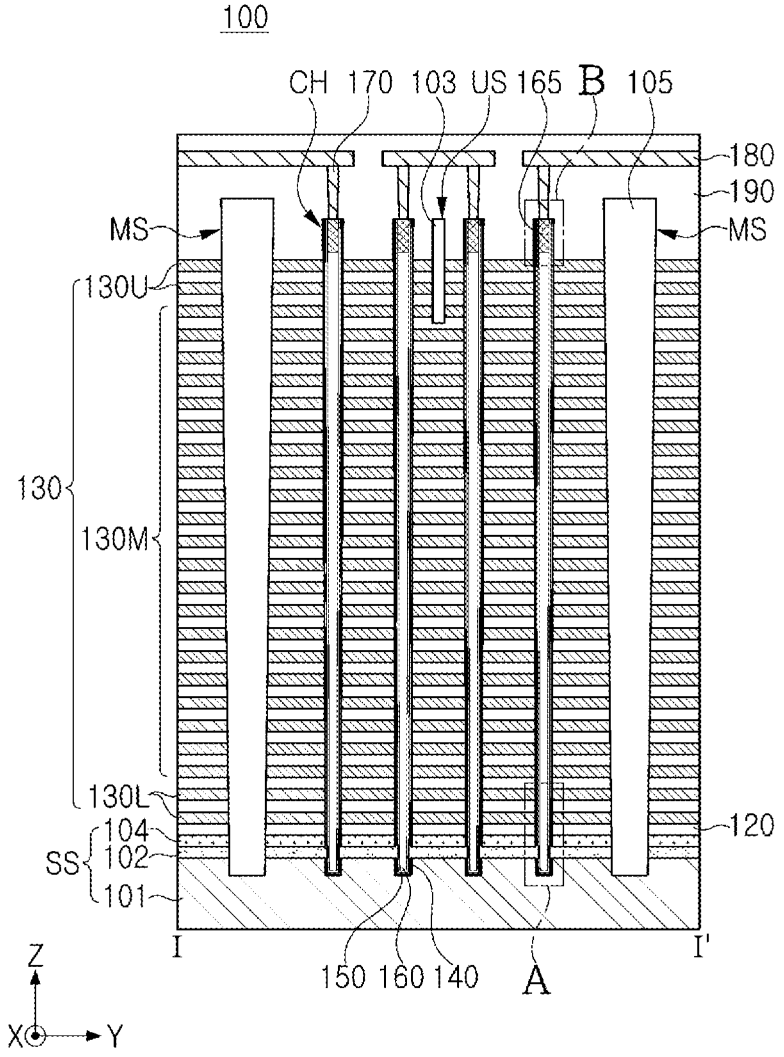
FIG. 2 is a schematic cross-sectional view of a semiconductor device according to example embodiments, and illustrates a cross-section taken along line I-I' of FIG. 1.

FIG. 2 is a schematic cross-sectional view of a semiconductor device according to example embodiments. FIG. 2 illustrates a cross-section taken along line I-I' of FIG. 1.

Figure 3A:
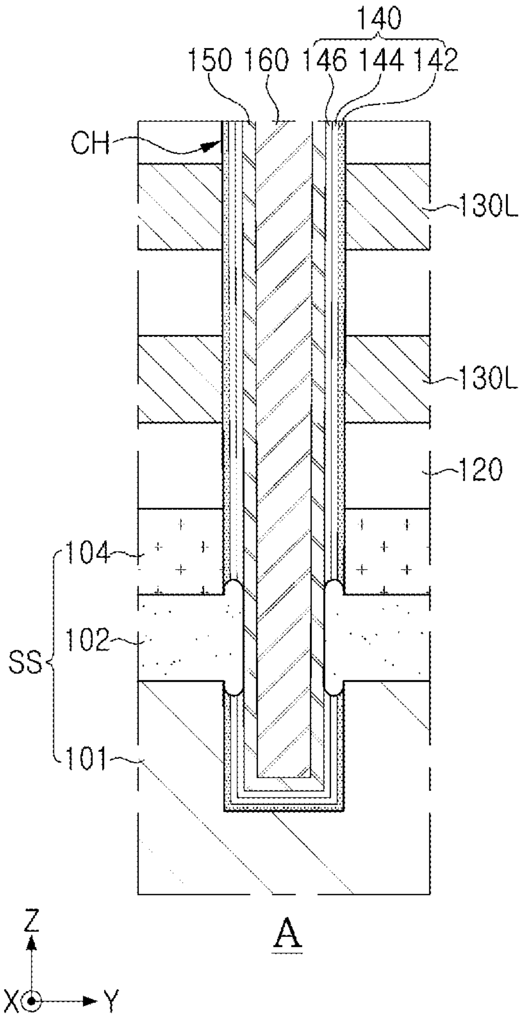
FIGS. 3A and 3B are partially enlarged views of a semiconductor device according to example embodiments.
Figure 3B:
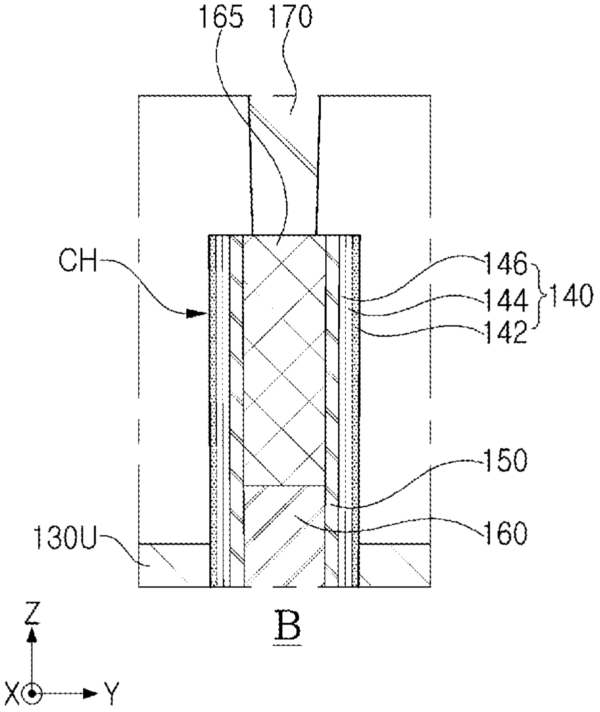

FIGS. 3A and 3B are partially enlarged views of a semiconductor device according to example embodiments. In FIG. 3A, area 'A' of FIG. 2 is enlarged, and in FIG. 3B, area 'B' of FIG. 2 is enlarged.

Referring to FIGS. 1 to 3B, a semiconductor device 100 may include a source structure SS, gate electrodes 130 stacked on the source structure SS, interlayer insulating layers 120 alternately stacked with the gate electrodes 130 on the source structure SS, channel structures CH extending (e.g., disposed to pass) through a stack structure of the gate electrodes 130, upper separation regions US extending into (e.g., penetrating through a portion of) the stack structure, separation regions MS extending by penetrating through the stack structure, contact plugs 170 on the channel structures CH, interconnection lines 180 on the contact plugs 170, and a cell area insulating layer 190 on (e.g., covering) the gate electrodes 130 and the channel structures CH. Each of the channel structures CH may include a dielectric layer 142, a charge storage layer 144, a tunneling layer 146, a channel layer 150, and a buried semiconductor layer 160 sequentially disposed on the gate electrodes 130, and may further include an upper channel pad 165.

For example, FIG. 3A shows that the dielectric layer 142 may be between the gate electrodes 130 and the charge storage layer 144, the tunneling layer 146 may be between charge storage layer 144 and the channel layer 150, and the channel layer 150 may be between the tunneling layer 146 and the buried semiconductor layer 160. Moreover, FIG. 3A shows that the buried semiconductor layer 160 may be between opposite sidewalls (e.g., in contact with an inner side surface) of the channel layer 150.

In the semiconductor device 100, one memory cell string may be configured with each channel structure CH as a center thereof, and a plurality of memory cell strings may be arranged in columns and rows in the X-direction and the Y-direction.

A substrate 101 may be a conductive plate layer, and may have an upper surface extending in the X-direction and the Y-direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor on insulator (SeOI) layer, or the like.

First and second horizontal conductive layers 102 and 104 may be sequentially stacked and disposed on the upper surface of the substrate 101. The first and second horizontal conductive layers 102 and 104 are source layers and may form a source structure SS together with the substrate 101. The source structure SS may function as a common source line of the semiconductor device 100. As illustrated in FIG. 3A, the first horizontal conductive layer 102 may be directly connected to (i.e., may contact) the channel layer 150 (e.g., opposite sidewalls of the channel layer 150).

The first and second horizontal conductive layers 102 and 104 may include a semiconductor material, such as polycrystalline silicon. In this case, at least the first horizontal conductive layer 102 may be a layer doped with impurities of the same conductivity type as that of the substrate 101. The second horizontal conductive layer 104 may be a doped layer or a layer including impurities diffused from the first horizontal conductive layer 102 while being an intrinsic semiconductor layer. However, the material of the second horizontal conductive layer 104 is not limited to the semiconductor material, and may be replaced with an insulating layer according to example embodiments. In example embodiments, a relatively thin insulating layer may be interposed between the upper surface of the first horizontal conductive layer 102 and the lower surface of the second horizontal conductive layer 104, and may be a first horizontal sacrificial layer 111 (refer to FIG. 11A) remaining without being removed during the manufacturing process of the semiconductor device 100.

The gate electrodes 130 may be vertically spaced apart from each other and stacked on the source structure SS to form a stack structure. The gate electrodes 130 include at least one lower gate electrode 130L forming the gate of the ground select transistor, memory gate electrodes 130M forming the plurality of memory cells, and upper gate electrodes 130U forming the gates of string select transistors. The number of the memory gate electrodes 130M constituting memory cells may be determined according to the capacity of the semiconductor device 100. According to an example embodiment, the number of upper and lower gate electrodes 130U and 130L may be 1 to 4 or more, respectively, and may have a structure the same as or different from that of the memory gate electrodes 130M. In example embodiments, the gate electrodes 130 may further include a gate electrode 130 disposed below the upper gate electrodes 130U and/or on the lower gate electrode 130L and forming an erase transistor used in an erase operation using a gate induced drain leakage (GIDL) phenomenon. In addition, a portion of the gate electrodes 130, for example, the memory gate electrodes 130M adjacent to the upper or lower gate electrodes 130U or 130L may be dummy gate electrodes.

The gate electrodes 130 may be disposed to be separated by a predetermined unit in the Y-direction by the separation regions MS. The gate electrodes 130 between the pair of separation regions MS may form one memory block, but the scope of the memory block is not limited thereto.

The gate electrodes 130 may include a metal material, for example, tungsten (W). In some embodiments, the gate electrodes 130 may include polycrystalline silicon or a metal silicide material. In example embodiments, the gate electrodes 130 may further include a diffusion barrier, and for example, the diffusion barrier may include tungsten nitride (WN), tantalum nitride (TaN), or titanium nitride (TiN), or combinations thereof.

The interlayer insulating layers 120 may be alternately disposed with the gate electrodes 130. Like the gate electrodes 130, the interlayer insulating layers 120 may be disposed to be spaced apart from each other in a direction perpendicular to the upper surface of the source structure SS. The interlayer insulating layers 120 may include an insulating material such as silicon oxide or silicon nitride.

The channel structures CH respectively form one memory cell string, and may be disposed to be spaced apart from each other while forming rows and columns on the substrate 101.

The channel structures CH may be disposed to form a grid pattern in an X-Y plane or may be disposed in a zigzag shape in one direction. The channel structures CH may have a pillar shape that fills the channel hole, and may have inclined sides that become narrower as they get closer to the substrate 101 according to an aspect ratio.

As illustrated in FIGS. 3A and 3B, each of the channel structures CH includes a dielectric layer 142, a charge storage layer 144, a tunneling layer 146, a channel layer 150, and a buried semiconductor layer 160 sequentially disposed on the gate electrodes 130, and may further include an upper channel pad 165. In the channel structure CH, the dielectric layer 142, the charge storage layer 144, and the tunneling layer 146 may be referred to as a gate stack layer 140.

The gate stack layer 140 may be disposed between the gate electrodes 130 and the channel layer 150, and may be disposed annularly in a channel hole in which the channel structure CH is disposed. The gate stack layer 140 may extend to upper and lower ends of the channel structure CH along the channel hole, and may be disposed to cover an inner side surface and an bottom surface of the channel hole. The gate stack layer 140 may be absent from a contact region in which the first horizontal conductive layer 102 and the channel layer 150 come into contact, in the channel hole. Portions of the gate stack layer 140 that are in the contact region may be removed to expose the channel layer 150.

An outer side surface of the dielectric layer 142 may contact the gate electrodes 130, and an inner side surface of the dielectric layer 142 may contact the charge storage layer 144. The dielectric layer 142 may include at least one of a ferroelectric material and an anti-ferroelectric material.

The ferroelectric material and the antiferroelectric material may include at least one of, for example, hafnium (Hf), zirconium (Zr), silicon (Si), yttrium (Y), aluminum (Al), gadolinium (Gd), strontium (Sr), lanthanum (La), titanium (Ti), and oxides thereof. For example, the ferroelectric material and the antiferroelectric material may include at least one of hafnium oxide ($HfO_2$), zirconium oxide ($ZrO_2$), and hafnium zirconium oxide (HZO), but are not limited thereto. The dielectric layer 142 may be formed of a single layer or multiple layers including different materials.

When the dielectric layer 142 includes a ferroelectric material, the dielectric layer 142 may have a relatively high dielectric constant, and may form an electric dipole by ferroelectric polarization, which is spontaneous polarization. The dielectric layer 142 may have a remnant polarization due to an electric dipole even in the absence of an external electric field. When the dielectric layer 142 includes an antiferroelectric material, the dielectric layer 142 may have polarization characteristics when an external electric field is applied. Accordingly, during the programming operation of the semiconductor device 100, the bias applied to the memory cell may be secured by the dielectric layer 142 even when the program voltage is reduced. When the program voltage may be reduced, a breakdown voltage margin between the gate electrodes 130 may be secured, and lengths of the gate electrodes 130 in the Z direction may be significantly reduced, and thus, the degree of integration may be improved without defects in the process.

The charge storage layer 144 may be a charge trapping layer or a floating gate conductive layer. The charge storage layer 144 may include, for example, silicon nitride (SiN). The tunneling layer 146 may tunnel charge into the charge storage layer 144 and may include, for example, silicon oxide (SiO), silicon nitride (SiN), silicon oxynitride (SiON), or combinations thereof.

The channel layer 150 may be disposed between the gate stack layer 140 and the buried semiconductor layer 160, and may be disposed in an annular shape in the channel hole. The channel layer 150 may continuously extend to the upper and lower ends of the channel structure CH along the channel hole. An outer side surface of the channel layer 150 may be in contact with the first horizontal conductive layer 102 in a contact region including a region on the level corresponding to the first horizontal conductive layer 102. Accordingly, the channel layer 150 may be electrically connected to the source structure SS.

The channel layer 150 may include an oxide semiconductor material. For example, the channel layer 150 may include an oxide including at least one of indium (In), zinc (Zn), and gallium (Ga). For example, the channel layer 150 may include at least one of zinc tin oxide (ZTO), indium zinc oxide (IZO), ZnO, indium gallium zinc oxide (IGZO), indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium Zinc Oxide (HfInZnO), Tin Indium Zinc Oxide (SnInZnO), Aluminum Tin Indium Zinc Oxide (AlSnInZnO), Silicon Indium Zinc Oxide (SiInZnO), Zinc Tin Oxide (ZnSnO), Aluminum Zinc Tin Oxide (AlZnSnO), Gallium Zinc Tin Oxide (GaZnSnO), Zirconium Zinc Tin Oxide (ZrZnSnO), and Indium Gallium Silicon Oxide (InGaSiO).

The oxide semiconductor material of the channel layer 150 may have an amorphous or crystalline structure. The oxide semiconductor material of the channel layer 150 may have N-type conductivity, but is not limited thereto. In example embodiments, the relative thicknesses of the respective layers constituting the gate stack layer 140 and the channel layer 150 may be variously changed.

As the channel layer 150 may include a material such as, for example, IGZO, carrier mobility may be improved, and temperature stability may be improved. Accordingly, in the semiconductor device 100, a cell current may be secured and it may be advantageous to secure a read voltage range. Also, sub-threshold swing characteristics may be improved, thereby improving a threshold voltage distribution of memory cells.

The buried semiconductor layer 160 may be disposed in the channel hole to fill an inner space of the channel layer 150. However, the buried semiconductor layer 160 does not extend to the upper end of the channel structure CH, but may extend to the lower surface of the channel pad 165. The entire outer surface of the buried semiconductor layer 160 may be surrounded by (e.g., in contact with) the channel layer 150. The level of the upper surface of the buried semiconductor layer 160 may be higher than the upper surface of an uppermost upper gate electrode 130U.

The buried semiconductor layer 160 may include an undoped semiconductor layer or a P-type semiconductor layer. The buried semiconductor layer 160 may include a material different from a material of the channel layer 150 or may be formed of a material different from that of the channel layer 150. For example, the buried semiconductor layer 160 may include silicon (Si), and for example, may be formed of a polycrystalline silicon layer. Since the buried semiconductor layer 160 includes a semiconductor material, a hole may be effectively supplied to the channel layer 150 during an erase operation of the semiconductor device 100, and thus, an erase speed may be improved.

The channel pad 165 may be disposed in an upper portion of the channel structure CH, for example, on the buried semiconductor layer 160 to fill an inner space of the channel layer 150. The channel pad 165 may contact the channel layer 150 through a side surface. The channel pad 165 may include, for example, an N-type semiconductor layer. For example, the channel pad 165 may be a region having a higher doping concentration than a doping concentration of the buried semiconductor layer 160, but is not limited thereto. The channel pad 165 may include (and/or may be formed of) a material different from a material of the channel layer 150. For example, the channel pad 165 may include silicon (Si), and for example, may be formed of a polycrystalline silicon layer.

The upper separation regions US may extend in the X-direction between the separation regions MS that are adjacent each other in the Y-direction. The upper separation regions US may be disposed to pass through some of the gate electrodes 130, including uppermost upper gate electrodes 130U, among the gate electrodes 130. As illustrated in FIG. 2, the upper separation regions US may divide (i.e., separate), for example, a total of three gate electrodes 130 in the Y-direction. However, the number of gate electrodes 130 divided by the upper separation regions US may be variously changed in some embodiments. The upper separation regions US may include an upper separation insulating layer 103. The upper separation insulating layer 103 may include an insulating material, for example, silicon oxide, silicon nitride, or silicon oxynitride.

The separation regions MS extend in the X-direction by extending/penetrating through the gate electrodes 130, the interlayer insulating layers 120 and the first and second horizontal conductive layers 102 and 104, and may be connected to (e.g., may contact/extend into) the substrate 101. As illustrated in FIG. 1, the separation regions MS may be disposed parallel to each other. The separation regions MS may divide (i.e., separate) the gate electrodes 130 in the Y-direction. The separation regions MS may have a shape in which a width decreases toward the substrate 101 due to a high aspect ratio. The separation regions MS may include an separation insulating layer 105 disposed in the trench. The separation insulating layer 105 may include an insulating material, for example, silicon oxide, silicon nitride, or silicon oxynitride.

Contact plugs 170 may be disposed on the channel structures CH. The contact plugs 170 may have a cylindrical shape, and may have side surfaces that are inclined to decrease in width toward the substrate 101 according to an aspect ratio. The contact plugs 170 may electrically connect the channel structures CH to the interconnection lines 180.

The interconnection lines 180 may be electrically connected to the contact plugs 170, and may correspond to a bit line of the semiconductor device 100 or may be an interconnection structure electrically connected to the bit line.

The contact plugs 170 and the interconnection lines 180 may be formed of a conductive material, and may include at least one of, for example, tungsten (W), aluminum (Al), and copper (Cu).

The cell area insulating layer 190 may be disposed to cover the gate electrodes 130 and the channel structures CH. The cell area insulating layer 190 may include a plurality of insulating layers according to example embodiments. The cell area insulating layer 190 may be formed of an insulating material, and may include, for example, at least one of silicon oxide, silicon nitride, and silicon oxynitride.

Figure 4A:
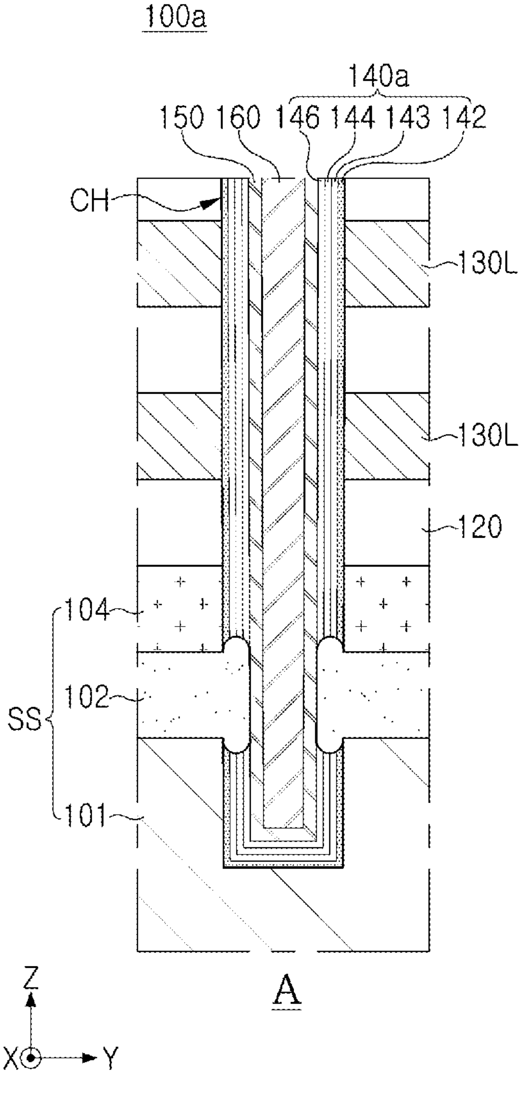
FIGS. 4A, 4B, and 4C are partially enlarged views schematically illustrating semiconductor devices according to example embodiments.
Figure 4B:
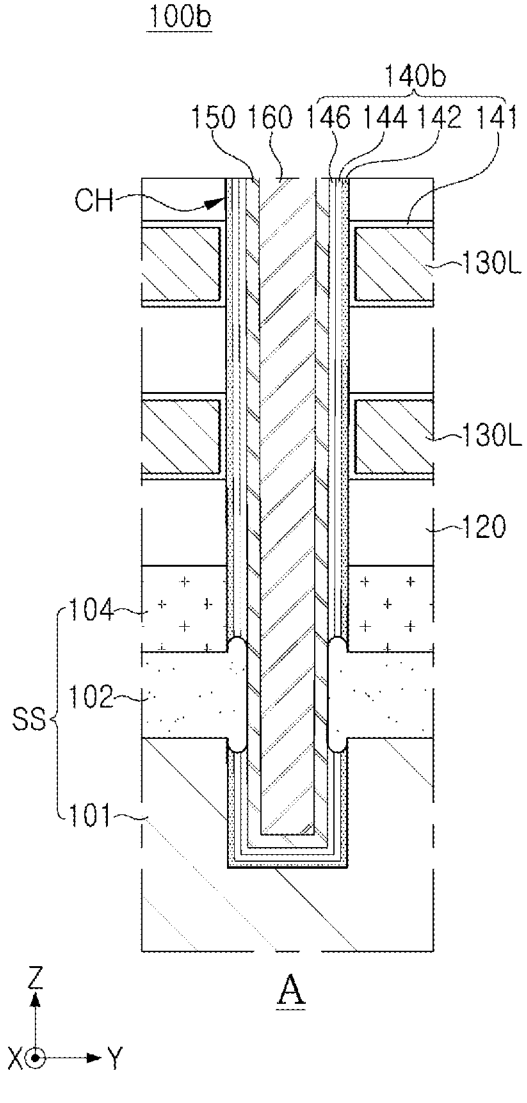
Figure 4C:
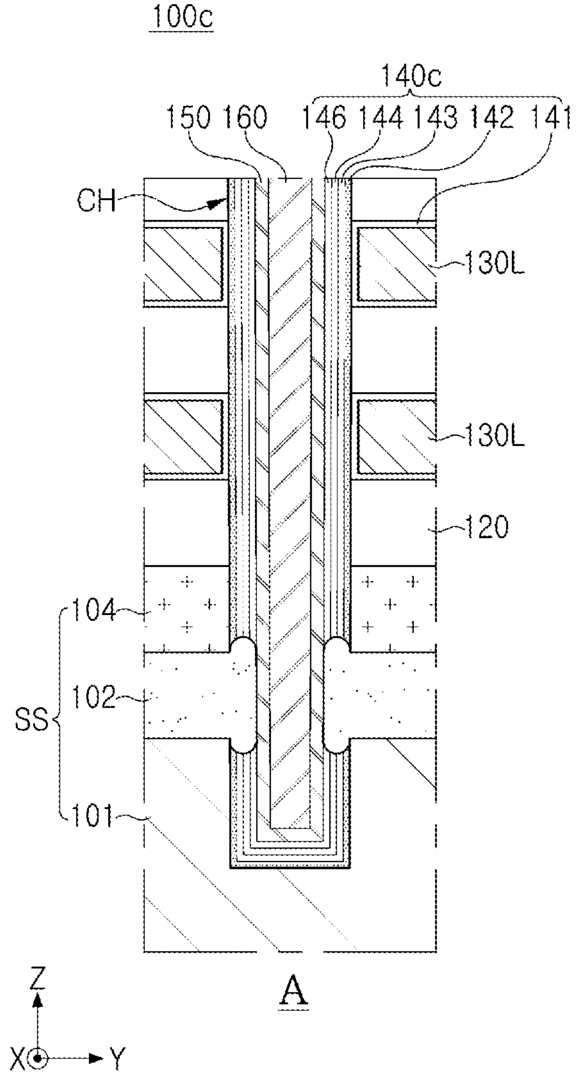

FIGS. 4A to 4C are partially enlarged views schematically illustrating semiconductor devices according to example embodiments. FIGS. 4A to 4C are enlarged views of an area corresponding to area ‘A’ of FIG. 2.

Referring to FIG. 4A, in a semiconductor device 100*a*, a gate stack layer 140*a* of a channel structure CH may further include a blocking layer 143 in addition to the dielectric layer 142, the charge storage layer 144, and the tunneling layer 146.

The blocking layer 143 may be disposed between the dielectric layer 142 and the charge storage layer 144, and may extend toward upper and lower ends of the channel structure CH. Portions of the blocking layer 143 may be removed from the periphery of the first horizontal conductive layer 102, similarly to the dielectric layer 142 and the charge storage layer 144. The blocking layer 143, together with the dielectric layer 142, may reduce/prevent loss of electrons stored in the charge storage layer 144.

The blocking layer 143 may include at least one of silicon oxide (SiO), silicon nitride (SiN), silicon oxynitride (SiON), and a high-k material. In this case, the high-k material refers to a dielectric material having a dielectric constant higher than a dielectric constant of silicon dioxide ($SiO_2$). The high-k material may include, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide (ZrSixOy), hafnium oxide ($HfO_2$), hafnium silicon oxide (HfSixOy), lanthanum oxide ($La_2O_3$), lanthanum aluminum oxide (LaAlxOy), lanthanum hafnium oxide (LaHfxOy), hafnium aluminum oxide (HfAlxOy), praseodymium oxide ($Pr_2O_3$), or combinations thereof. By further including the blocking layer 143, retention characteristics of the semiconductor device 100*a* may be enhanced.

Referring to FIG. 4B, in a semiconductor device 100*b*, a gate stack layer 140*b* of the channel structure CH may further include a horizontal blocking layer 141 in addition to the dielectric layer 142, the charge storage layer 144, and the tunneling layer 146.

The horizontal blocking layer 141 may be disposed between the gate electrodes 130 and the dielectric layer 142, and may extend horizontally along upper and lower surfaces of each of the gate electrodes 130. Accordingly, the horizontal blocking layer 141 may not be a layer disposed in the channel hole. The horizontal blocking layer 141, together with the dielectric layer 142, may reduce/prevent loss of charges stored in the charge storage layer 144. For the material of the horizontal blocking layer 141, the description of the blocking layer 143 described above with reference to FIG. 4A may be equally applied. By further including the horizontal blocking layer 141, the retention characteristics of the semiconductor device 100*b* may be enhanced.

Referring to FIG. 4C, in a semiconductor device 100*c*, a gate stack layer 140*c* of the channel structure CH may further include a horizontal blocking layer 141 and a blocking layer 143 in addition to the dielectric layer 142, the charge storage layer 144, and the tunneling layer 146.

For the horizontal blocking layer 141 and the blocking layer 143, the description described above with reference to FIGS. 4A and 4B may be equally applied. In this embodiment, the horizontal blocking layer 141 and the blocking layer 143 may form a blocking structure together with the dielectric layer 142.

Figure 5:
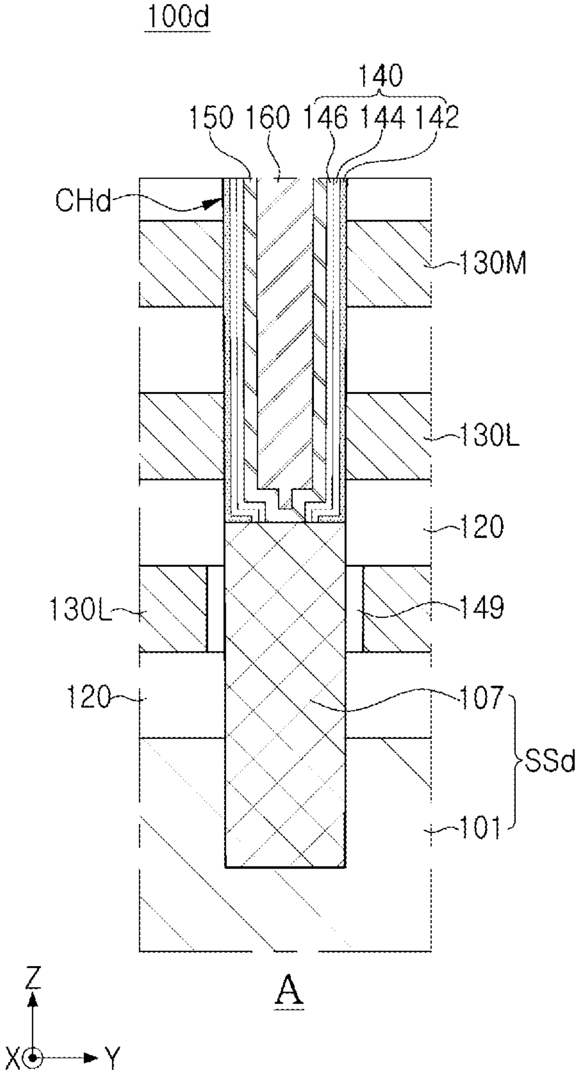
FIG. 5 is a partially enlarged view schematically illustrating a semiconductor device according to example embodiments.

FIG. 5 is a partially enlarged view schematically illustrating a semiconductor device according to example embodiments. FIG. 5 illustrates an enlarged area corresponding to area ‘A’ of FIG. 2.

Referring to FIG. 5, a semiconductor device 100*d* may not include the first and second horizontal conductive layers 102 and 104 on the substrate 101, unlike the example embodiments of FIGS. 2 and 3A. In addition, a source structure SSd may further include an epitaxial layer 107 disposed below a channel structure CHd in addition to the substrate 101.

The epitaxial layer 107 may be disposed on the substrate 101, below the channel structure CHd, and may be disposed on a side surface of at least one lower gate electrode 130L. The epitaxial layer 107 may be disposed in the recessed region of the substrate 101. The height of the upper surface of the epitaxial layer 107 may be higher than an upper surface of a lowermost lower gate electrode 130L and may be lower than a lower surface of a lower gate electrode 130L disposed thereon, but the present inventive concept is not limited thereto. The upper surface of the epitaxial layer 107 may contact and/or be electrically connected to the lower surface of the channel layer 150.

The lower end of the gate stack layer 140 may be positioned on the upper surface of the epitaxial layer 107. A gate insulating layer 149 may be further disposed between the epitaxial layer 107 and the lower gate electrode 130L adjacent thereto. The shape of the channel structure CHd and the source structure SSd as described above may be applied to other embodiments.

Figure 6:
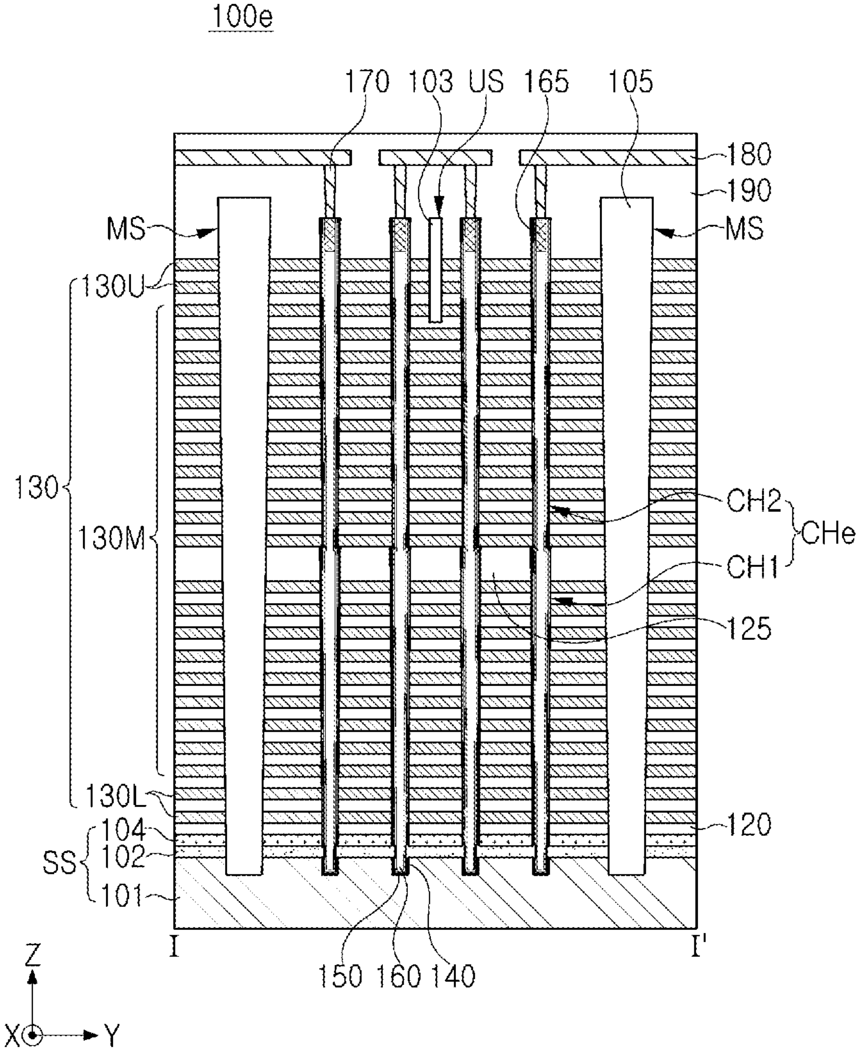
FIG. 6 is a schematic cross-sectional view of a semiconductor device according to example embodiments.

FIG. 6 is a schematic cross-sectional view of a semiconductor device according to example embodiments.

Referring to FIG. 6, in a semiconductor device 100*e*, the stack structure of the gate electrodes 130 may be formed of vertically stacked lower and upper stack structures, and may include first and second channel structures CH1 and CH2 in which channel structures CHe are vertically stacked. The structure of the channel structures Che as described above may be introduced to stably form the channel structures CHe when the number of the stacked gate electrodes 130 is relatively large. According to example embodiments, the number of stacked channel structures may be variously changed.

The channel structures CHe may have a shape in which lower first channel structures CH1 and upper second channel structures CH2 are electrically and/or physically connected, and may have a bent portion due to a difference in width in the connection region. A channel layer 150, a gate stack layer 140, and a buried semiconductor layer 160 may be electrically and physically connected to each other between the first channel structure CH1 and the second channel structure CH2. A channel pad 165 may be disposed only on the upper end of the upper second channel structure CH2. However, in example embodiments, the first channel structure CH1 and the second channel structure CH2 may each include the channel pad 165, and in this case, the channel pad 165 of the first channel structure CH1 may be electrically and physically connected to the channel layer 150 of the second channel structure CH2.

A relatively thick upper interlayer insulating layer 125 may be disposed on an uppermost portion of the lower stack structure. However, the shapes of the interlayer insulating layers 120 and the upper interlayer insulating layer 125 may be variously changed in the example embodiments. As such, the shape of the plurality of stacked channel structures CHe may be applied to other embodiments.

Figure 7:
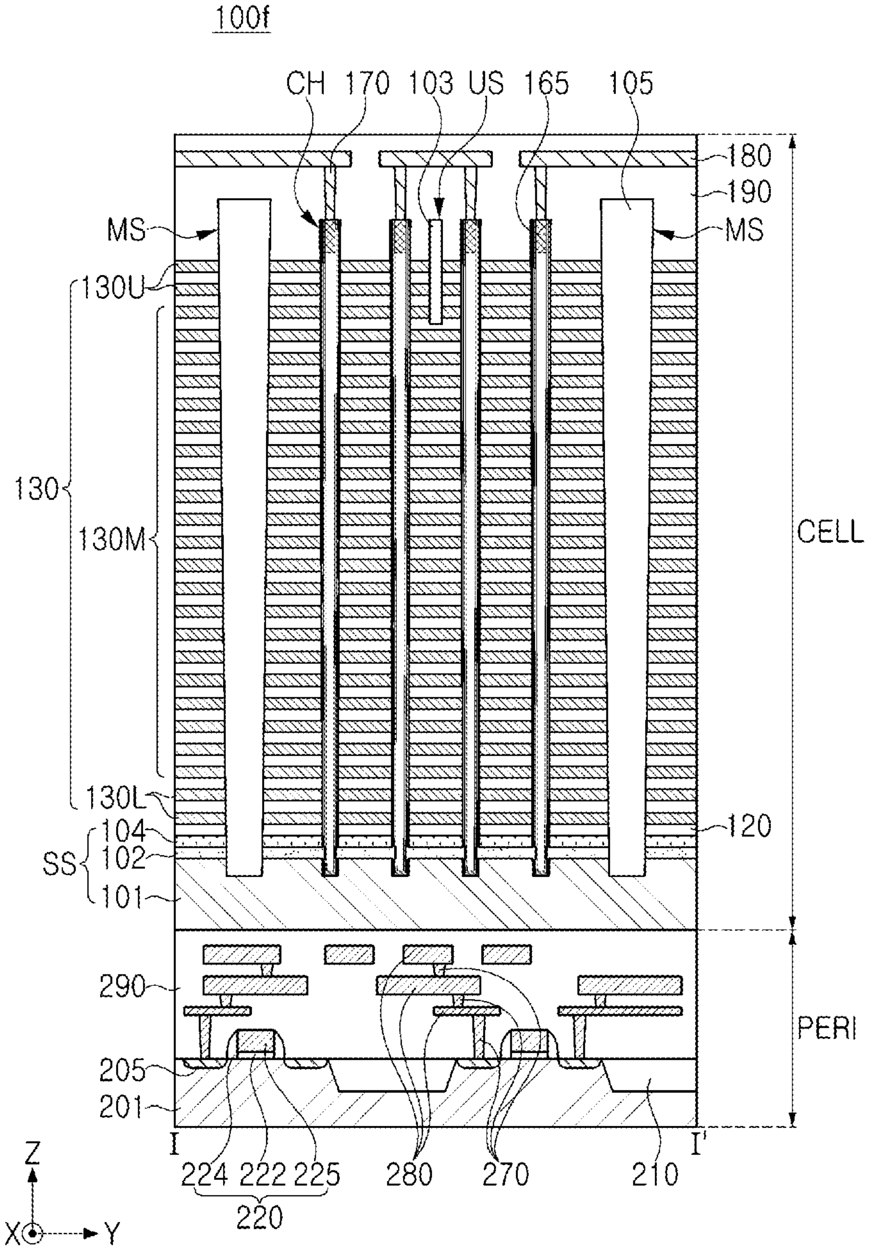
FIG. 7 is a schematic cross-sectional view of a semiconductor device according to example embodiments.

FIG. 7 is a schematic cross-sectional view of a semiconductor device according to example embodiments.

Referring to FIG. 7, a semiconductor device 100*f* may include a memory cell area CELL and a peripheral circuit area PERI stacked vertically. The memory cell area CELL may be disposed on the peripheral circuit area PERI. For example, in the case of the semiconductor device 100 of FIG. 2, it may be understood that the peripheral circuit area PERI is disposed on a substrate 101 in an unillustrated region, or as in the semiconductor device 100*f* of the present embodiment, the peripheral circuit area PERI is disposed therebelow. In some embodiments, the memory cell area CELL may be disposed below the peripheral circuit area PERI. For the description of the memory cell area CELL, the same description with reference to FIGS. 1 to 3B may be applied.

The peripheral circuit area PERI may include a base substrate 201, circuit elements 220 disposed on the base substrate 201, circuit contact plugs 270, and circuit interconnection lines 280.

The base substrate 201 may have an upper surface extending in the X-direction and the Y-direction. Device isolation layers 210 may be formed in the base substrate 201 to define an active region. Source/drain regions 205 including impurities may be disposed in a portion of the active region. The base substrate 201 may include a semiconductor material, for example, a group IV semiconductor, a group III-V compound semiconductor, or a group II-VI compound semiconductor. The base substrate 201 may be provided as a bulk wafer or an epitaxial layer. In this embodiment, the upper substrate 101 may be provided as a polycrystalline semiconductor layer such as a polycrystalline silicon layer or an epitaxial layer.

The circuit elements 220 may include a horizontal transistor. Each of the circuit elements 220 may include a circuit gate dielectric layer 222, a spacer layer 224, and a circuit gate electrode 225. Source/drain regions 205 may be disposed in the base substrate 201, on both sides of the circuit gate electrode 225.

A peripheral region insulating layer 290 may be disposed on the circuit element 220, on the base substrate 201. Circuit contact plugs 270 may pass through the peripheral region insulating layer 290 to be electrically connected to the source/drain regions 205. An electrical signal may be applied to the circuit element 220 by the circuit contact plugs 270. In an area not illustrated, the circuit contact plugs 270 may also be electrically connected to the circuit gate electrode 225. The circuit interconnection lines 280 may be electrically connected to the circuit contact plugs 270 and may be disposed in a plurality of layers.

In a semiconductor device 100*f*, after the peripheral circuit area PERI is first manufactured, the substrate 101 of the memory cell area CELL may be formed thereon to manufacture the memory cell area CELL. The substrate 101 may have the same size as the base substrate 201 or may be formed smaller than the base substrate 201. The memory cell area CELL and the peripheral circuit area PERI may be connected to each other in an area not illustrated. For example, one end of the gate electrode 130 in the Y-direction may be electrically connected to the circuit elements 220. The form in which the memory cell area CELL and the peripheral circuit area PERI are vertically stacked may be applied to other embodiments.

Figure 8:
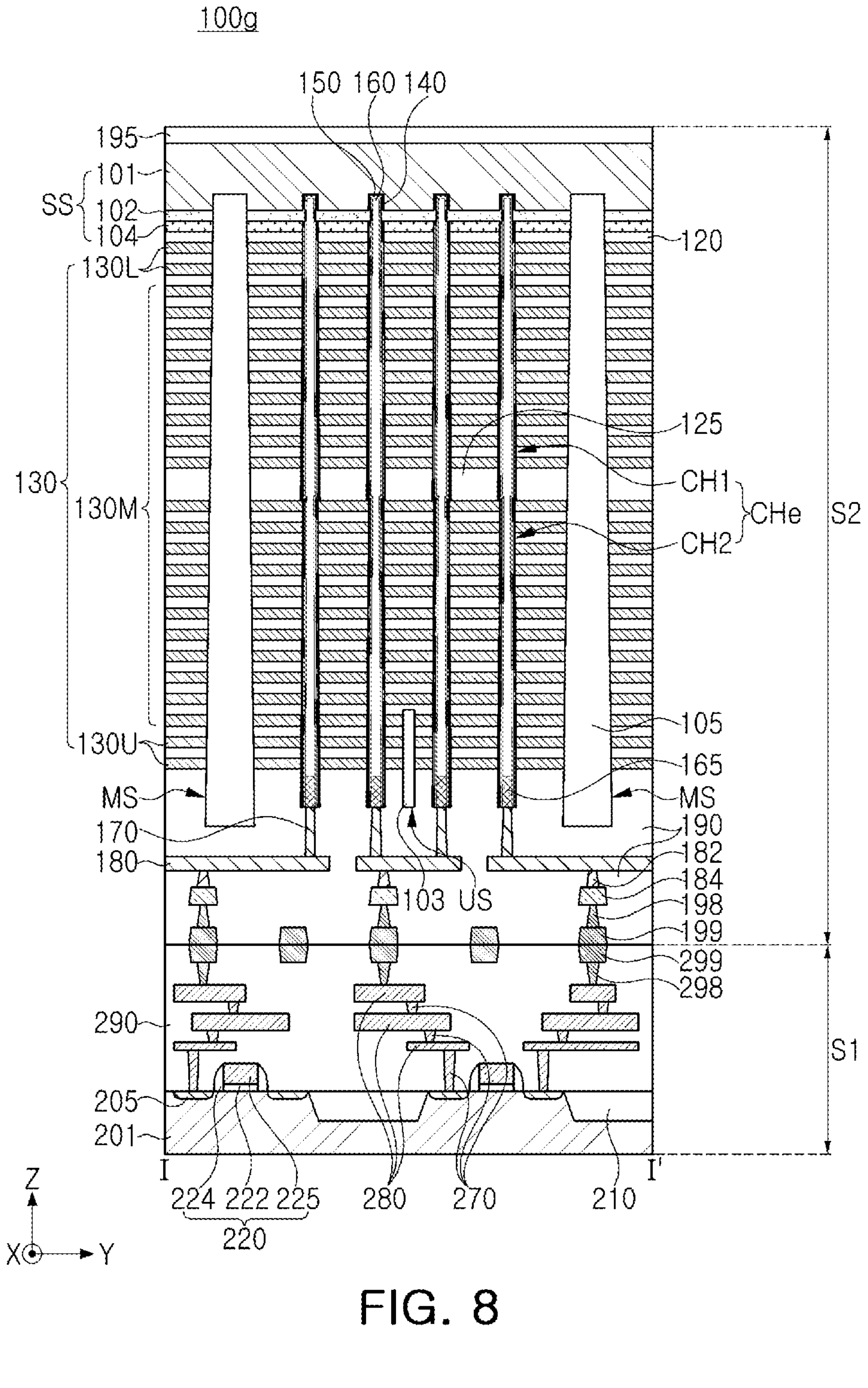
FIG. 8 is a schematic cross-sectional view of a semiconductor device according to example embodiments.

FIG. 8 is a schematic cross-sectional view of a semiconductor device according to example embodiments.

Referring to FIG. 8, a semiconductor device 100*g* may include a first semiconductor structure S1 and a second semiconductor structure S2 bonded by a wafer bonding method.

The description of the peripheral circuit area PERI described above with reference to FIG. 7 may be applied to the first semiconductor structure S1. However, the first semiconductor structure S1 may further include first bonding vias 298 and first bonding pads 299, which are bonding structures. The first bonding vias 298 may be disposed on uppermost circuit interconnection lines 280 to be electrically connected to the circuit interconnection lines 280. At least a portion of the first bonding pads 299 may be electrically connected to the first bonding vias 298, on the first bonding vias 298. The first bonding pads 299 may be electrically connected to the second bonding pads 199 of the second semiconductor structure S2. The first bonding pads 299 together with the second bonding pads 199 may provide an electrical connection path according to the bonding between the first semiconductor structure S1 and the second semiconductor structure S2. The first bonding vias 298 and the first bonding pads 299 may include a conductive material, for example, copper (Cu).

For the second semiconductor structure S2, the descriptions with reference to FIGS. 1 to 3B may be equally applied, unless otherwise specified. The second semiconductor structure S2 may further include lower contact plugs 182 and lower interconnection lines 184 that are wiring structures, and may further include second bonding vias 198 and second bonding pads 199 that are bonding structures. The second semiconductor structure S2 may further include a protective layer 195 covering the upper surface of the substrate 101.

The lower contact plugs 182 are disposed below the interconnection lines 180, and may electrically connect the interconnection lines 180 and the lower interconnection lines 184. However, in example embodiments, the number of layers and arrangement of the contact plugs and interconnection lines constituting the wiring structure may be variously changed. The lower contact plugs 182 and the lower interconnection lines 184 may be formed of a conductive material, and may include, for example, at least one of tungsten (W), aluminum (Al), and copper (Cu).

The second bonding vias 198 and the second bonding pads 199 may be disposed below lowermost lower interconnection lines 184. The second bonding vias 198 may be electrically connected to the interconnection lines 180 and the second bonding pads 199, and the second bonding pads 199 may be bonded to the first bonding pads 299 of the first semiconductor structure S1. The second bonding vias 198 and the second bonding pads 199 may include a conductive material, for example, copper (Cu).

The first semiconductor structure S1 and the second semiconductor structure S2 may be bonded by copper (Cu)-to-copper (Cu) bonding by the first bonding pads 299 and the second bonding pads 199. In addition to the copper (Cu)-to-copper (Cu) bonding, the first semiconductor structure S1 and the second semiconductor structure S2 may be additionally bonded by dielectric-to-dielectric bonding. The dielectric-to-dielectric bonding may be bonding by dielectric layers forming a portion of each of the peripheral region insulating layer 290 and the cell area insulating layer 190 and surrounding each of the first bonding pads 299 and the second bonding pads 199. Accordingly, the first semiconductor structure S1 and the second semiconductor structure S2 may be bonded without a separate adhesive layer.

FIGS. 9A to 10B are diagrams illustrating an operation of a semiconductor device according to example embodiments.

Figure 9A:
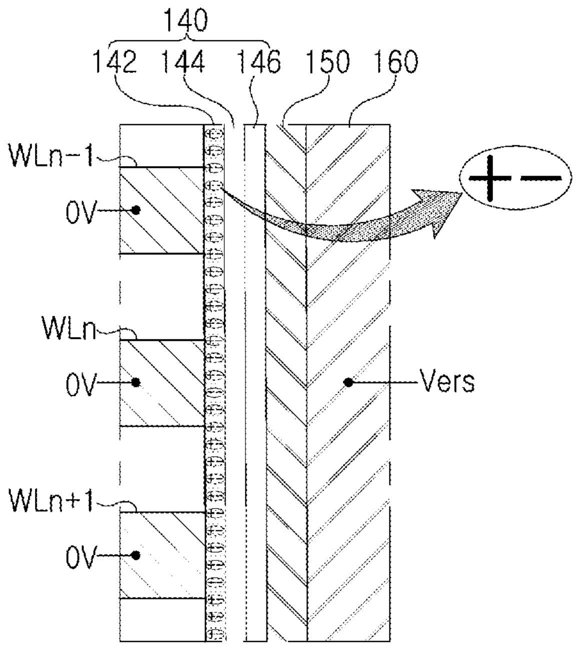
FIGS. 9A, 9B, 10A, and 10B are diagrams illustrating an operation of a semiconductor device according to example embodiments.
Figure 9B:
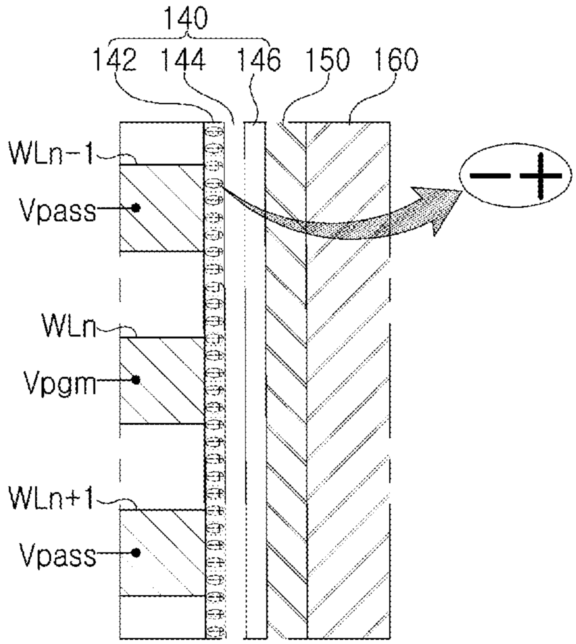

First, referring to FIGS. 9A and 9B, word lines $WL_{n-1}$, $WL_n$, and $WL_{n+1}$ by the gate electrodes 130 (refer to FIG. 2), the gate stack layer 140, the channel layer 150, and the buried semiconductor layer 160 are schematically illustrated. FIG. 9A illustrates a voltage application state during an erase operation, and FIG. 9B illustrates a voltage application state during a program operation.

As illustrated in FIG. 9A, during an erase operation, a voltage of, for example, 0 volts (V) may be applied to the word lines $WL_{n-1}$, $WL_n$, and $WL_{n+1}$, and an erase voltage Vers may be applied to the buried semiconductor layer 160 (and/or another part of the channel structure CH) through the source structure SS (refer to FIG. 2). The erase voltage Vers may be a positive voltage. In some embodiments, the erase voltage Vers may also be applied to the channel layer 150. Accordingly, in the dielectric layer 142, electric dipoles may be arranged in the (+−) direction such that the anode is positioned toward the word lines $WL_{n-1}$, $WL_n$, and $WL_{n+1}$ and the cathode is positioned toward the buried semiconductor layer 160, as illustrated. The threshold voltage of the erased memory cells may be determined by the ferroelectric polarization effect of the dielectric layer 142 as described above and the amount of holes injected into the charge storage layer 144.

As illustrated in FIG. 9B, during the program operation, a program voltage Vpgm may be applied to a selected word line WLn, and a pass voltage Vpass may be applied to unselected word lines $WL_{n-1}$ and $WL_{n+1}$. The program voltage Vpgm and the pass voltage Vpass may be positive voltages. Accordingly, the electric dipoles in the dielectric layer 142 may change in a direction opposite to that in the erased state. The electric dipoles may be arranged in the (−+) direction such that a cathode is positioned toward the word lines $WL_{n-1}$, $WL_n$, and $WL_{n+1}$ and an anode is positioned toward the buried semiconductor layer 160, as illustrated. The threshold voltage of the memory cell programmed by the selected word line $WL_n$ may be determined by the polarization effect of the dielectric layer 142 and the amount of electrons trapped in the charge storage layer 144.

As described above, during a program operation on the erased memory cells, the electric dipoles in the dielectric layer 142 are arranged in opposite directions, which may cause a shift in the threshold voltage during programming, compared to a case in which the dielectric layer 142 is not present. To impede/prevent the threshold voltage shift, a method of compensating for the threshold voltage shift during an erase operation will be described with reference to FIGS. 10A and 10B.

Figure 10A:
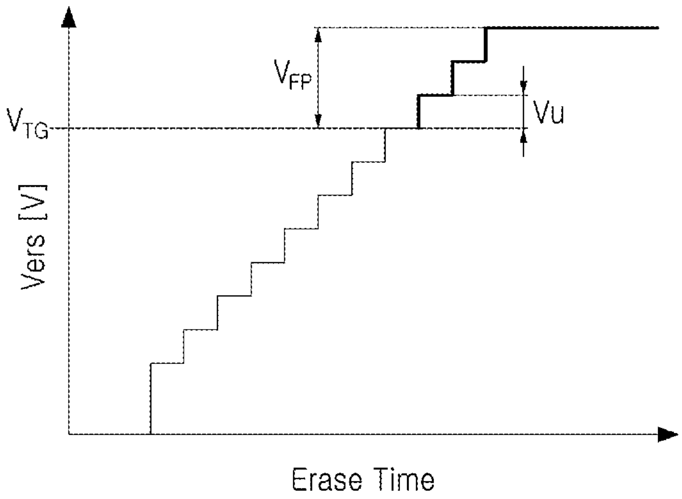
Figure 10B:
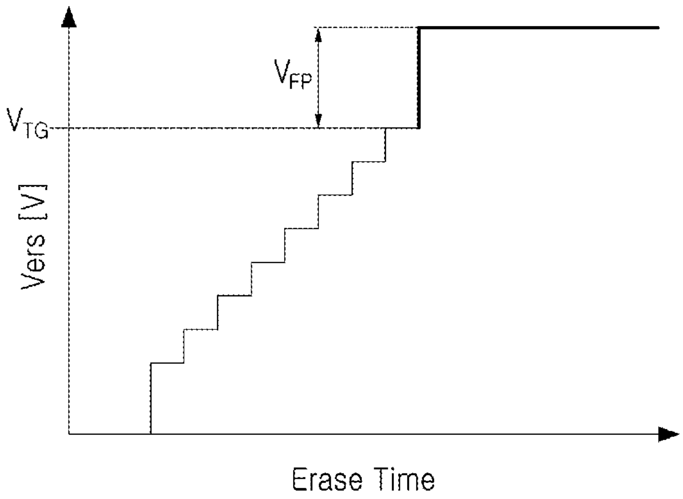

An erase operation according to example embodiments will be described with reference to FIGS. 10A and 10B. FIGS. 10A and 10B illustrate changes in the erase voltage Vers according to time during an erase operation using an incremental step pulse erase (ISPE) method.

The erase voltage Vers may increase (e.g., repeatedly increase) by the level of a unit step voltage Vu until reaching a target voltage level $V_{TG}$. The erase voltage Vers may step up, for example, from 0 V to the target voltage level $V_{TG}$, for example, to a voltage between 15 V and 25 V. In the case of a semiconductor device of the comparative example, not including the dielectric layer 142, after reaching the target voltage level $V_{TG}$, an erase verify operation may be performed and the erase operation may be completed. Meanwhile, in example embodiments, after the erase verify, the erase voltage Vers (e.g., by the level of the unit step voltage Vu) may be further applied to the channel structure CH through the source structure SS as much as a polarization effect voltage $V_{FP}$ in consideration of the ferroelectric polarization effect of the dielectric layer 142. The polarization effect voltage $V_{FP}$ may correspond to, for example, a voltage due to ferroelectric polarization.

As illustrated in FIG. 10A, the polarization effect voltage $V_{FP}$ may be applied multiple times by dividing the polarization effect voltage $V_{FP}$ by the unit step voltage Vu. Accordingly, the total number of loops to which a voltage is applied during an erase operation may increase by the number of times calculated as $V_{FP}$/Vu. Alternatively, as illustrated in FIG. 10B, the polarization effect voltage $V_{FP}$ may be applied all at once as a step voltage. Accordingly, the total number of loops to which voltage is applied during the erase operation increases by one time.

In example embodiments, after compensating for the polarization effect voltage $V_{FP}$ as described above, the erase verify operation may not be additionally performed. This is because the polarization effect voltage $V_{FP}$ is applied to compensate for a threshold voltage shift during programming through additional erasing.

FIGS. 11A to 11F are schematic cross-sectional views illustrating a method of manufacturing a semiconductor device according to example embodiments. FIGS. 11A to 11F illustrate regions corresponding to the region illustrated in FIG. 2.

Figure 11A:
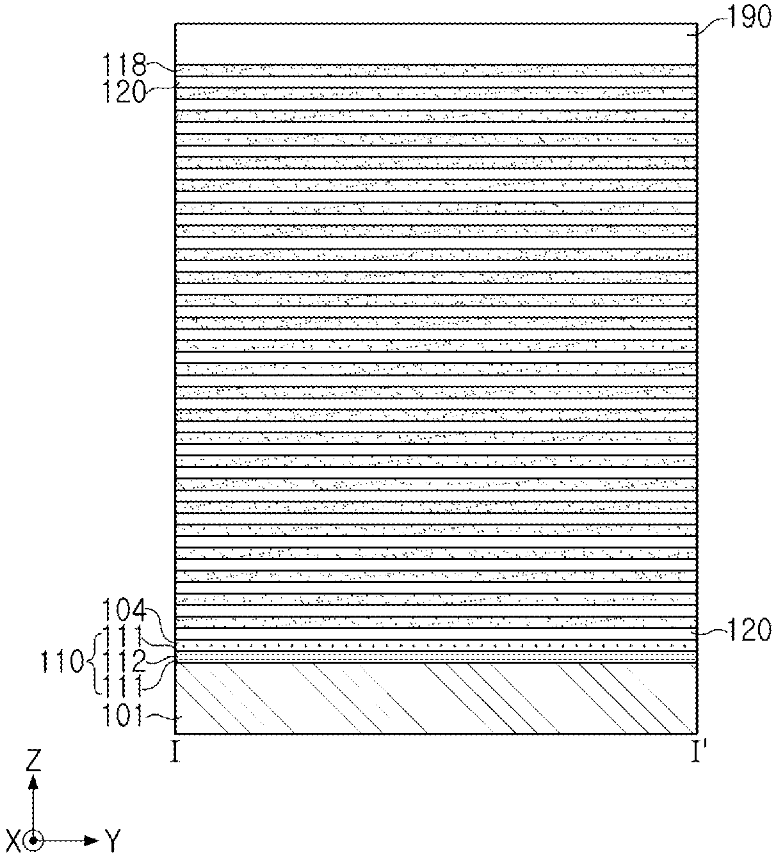
FIGS. 11A, 11B, 11C, 11D, 11E, and 11F are schematic cross-sectional views illustrating a method of manufacturing a semiconductor device according to example embodiments.

Referring to FIG. 11A, a horizontal sacrificial structure 110 and a second horizontal conductive layer 104 may be formed on a substrate 101, and sacrificial insulating layers 118 and interlayer insulating layers 120 may be alternately stacked.

The horizontal sacrificial structure 110 may include first and second horizontal sacrificial layers 111 and 112. The first and second horizontal sacrificial layers 111 and 112 may be stacked on the substrate 101 in such a manner that the first horizontal sacrificial layers 111 are disposed on upper and lower portions of the second horizontal sacrificial layer 112. The first and second horizontal sacrificial layers 111 and 112 may include different materials. The first and second horizontal sacrificial layers 111 and 112 may be layers replaced with the first horizontal conductive layer 102 (refer to FIG. 2) through a subsequent process. For example, the first horizontal sacrificial layers 111 may be formed of the same material as the interlayer insulating layers 120, and the second horizontal sacrificial layer 112 may be formed of the same material as the sacrificial insulating layers 118. The second horizontal conductive layer 104 may be formed on the first and second horizontal sacrificial layers 111 and 112.

Portions of the sacrificial insulating layers 118 may be replaced by the gate electrodes 130 (refer to FIG. 2) through a subsequent process. The sacrificial insulating layers 118 may be formed of a material different from that of the interlayer insulating layers 120, and may be formed of a material that may be etched with etch selectivity with respect to the interlayer insulating layers 120 under specific etching conditions. For example, the interlayer insulating layer 120 may be formed of at least one of silicon oxide and silicon nitride, and the sacrificial insulating layers 118 may be formed of a material different from a material of the interlayer insulating layer 120, selected from silicon, silicon oxide, silicon carbide, and silicon nitride. In example embodiments, the thicknesses of the interlayer insulating layers 120 may not all be the same. The thickness of the interlayer insulating layers 120 and the sacrificial insulating layers 118 and the number of layers constituting the insulating layers 120 may be variously changed from those illustrated.

Next, a portion of the cell area insulating layer 190 covering the stack structure of the sacrificial insulating layers 118 and the interlayer insulating layers 120 may be formed.

Figure 11B:
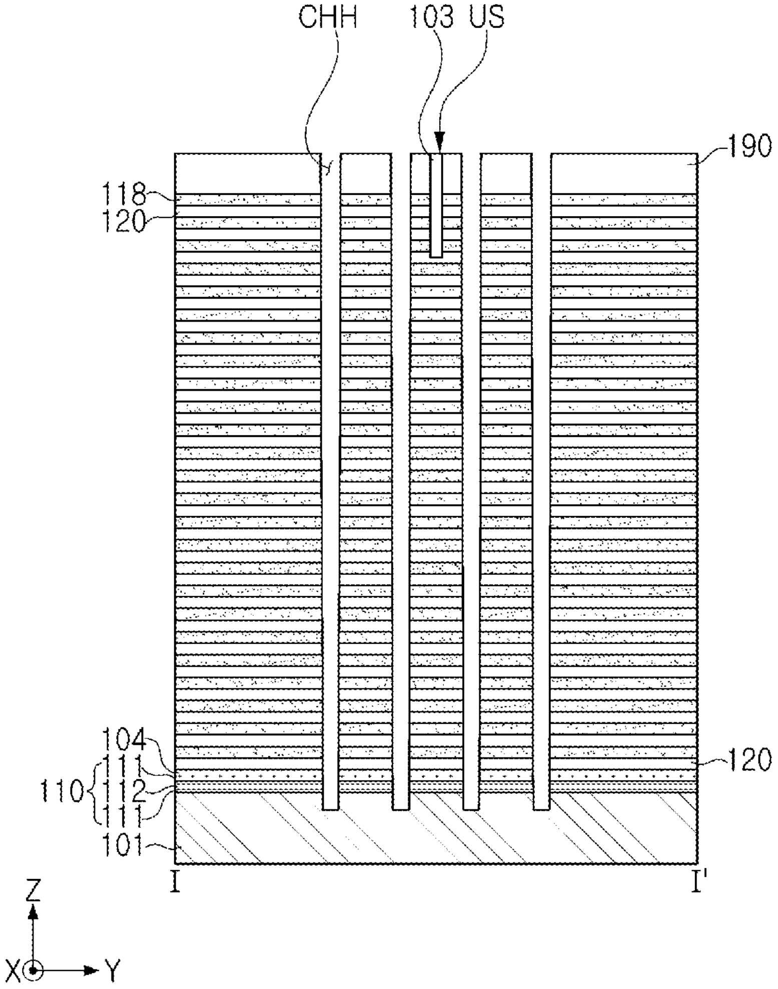

Referring to FIG. 11B, an upper separation region US may be formed, and channel holes CHH passing through the stack structure of the sacrificial insulating layers 118 and the interlayer insulating layers 120 may be formed.

First, the upper separation region US may be formed by removing a portion of the sacrificial insulating layers 118 and the interlayer insulating layers 120. After exposing the region in which the upper separation region US is to be formed using a separate mask layer, and removing a predetermined number of sacrificial insulating layers 118 and interlayer insulating layers 120 from the top, the upper separation insulating layer 103 may be formed by depositing an insulating material.

The channel holes CHH may be formed by anisotropically etching the sacrificial insulating layers 118 and the interlayer insulating layers 120 using a mask layer. Due to the height of the stack structure, sidewalls of the channel holes CHH may not be perpendicular to the upper surface of the substrate 101, but rather may be slanted. The channel holes CHH may be formed to recess a portion of the substrate 101.

Figure 11C:
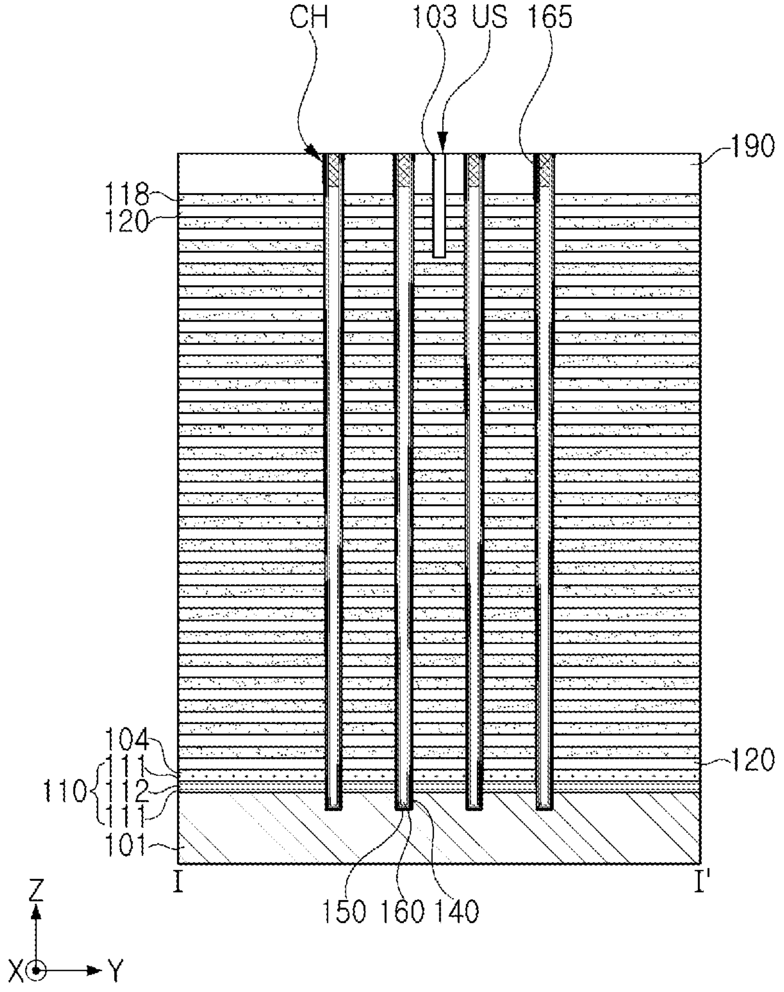

Referring to FIG. 11C, the channel structures CH may be formed by forming the gate stack layer 140, the channel layer 150, the buried semiconductor layer 160, and the channel pad 165 in the respective channel holes CHH.

The dielectric layer 142, the charge storage layer 144, and the tunneling layer 146 of FIG. 3A constituting the gate stack layer 140, and the channel layer 150, may be substantially conformally formed on inner surfaces of the channel holes CHH to a uniform thickness. The gate stack layer 140 and the channel layer 150 may be formed to have a uniform thickness using an atomic layer deposition (ALD) or chemical vapor deposition (CVD) process.

The buried semiconductor layer 160 may be formed to fill the channel holes CHH. In some embodiments, an air gap may be formed in the buried semiconductor layer 160 depending on the width of the buried semiconductor layer 160.

The channel pad 165 may be formed, for example, after removing a portion of the buried semiconductor layer 160 by an etch-back process on the channel hole CHH or may be formed by implanting dopants into an upper end of the buried semiconductor layer 160.

Figure 11D:
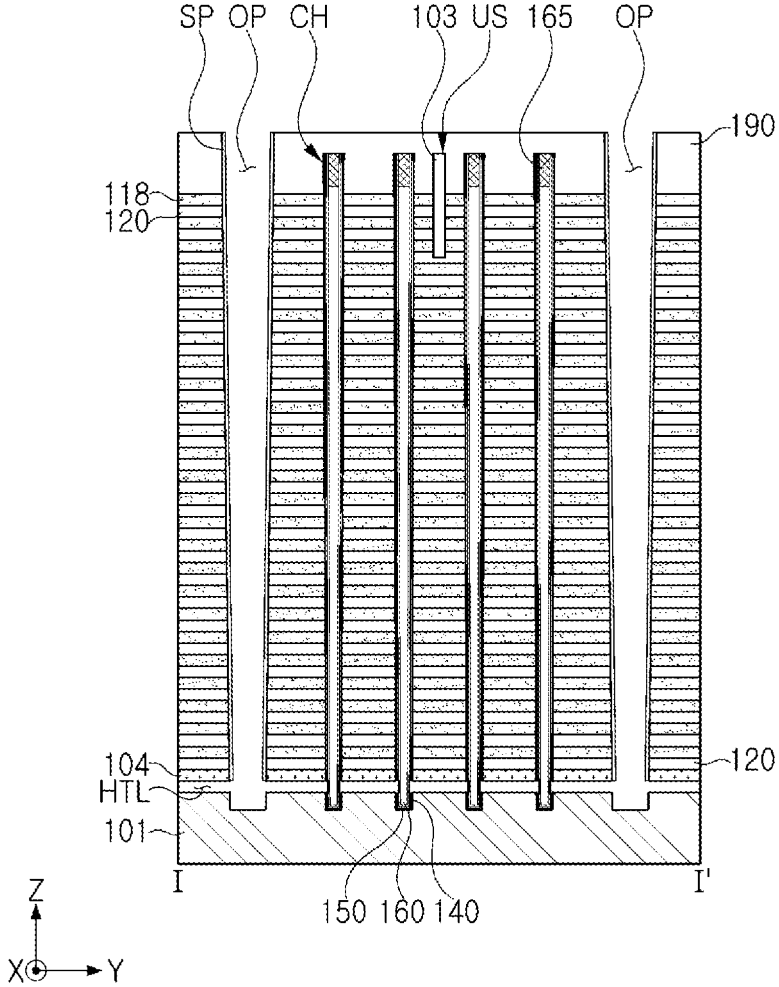

Referring to FIG. 11D, trenches OP passing through the stack structure of the sacrificial insulating layers 118 and the interlayer insulating layers 120 may be formed in regions corresponding to the separation regions MS (see FIG. 2), and the first and second horizontal sacrificial layers 111 and 112 may be removed, thereby forming a horizontal tunnel portion HTL.

First, a cell area insulating layer 190 may be additionally formed (and thus may be thicker than in FIGS. 11A-11C) on the channel structures CH, and the trenches OP may be formed. The trenches OP may be formed to pass through the stack structure of the sacrificial insulating layers 118 and the interlayer insulating layers 120, pass through the second horizontal conductive layer 104 at a lower portion, and extend in the X-direction.

Next, sacrificial spacer layers SP may be formed in the trenches OP, and the second horizontal sacrificial layer 112 may be exposed through an etch-back process. The horizontal tunnel portion HTL may be formed by selectively removing the exposed second horizontal sacrificial layer 112 and then removing the upper and lower first horizontal sacrificial layers 111. The horizontal sacrificial structure 110 may be removed by, for example, a wet etching process. During the removal process of the horizontal sacrificial structure 110, a portion of the gate stack layer 140 exposed in the region in which the second horizontal sacrificial layer 112 has been removed is also removed, thereby forming a contact region in which the outer side surface of the channel layer 150 is exposed.

Figure 11E:
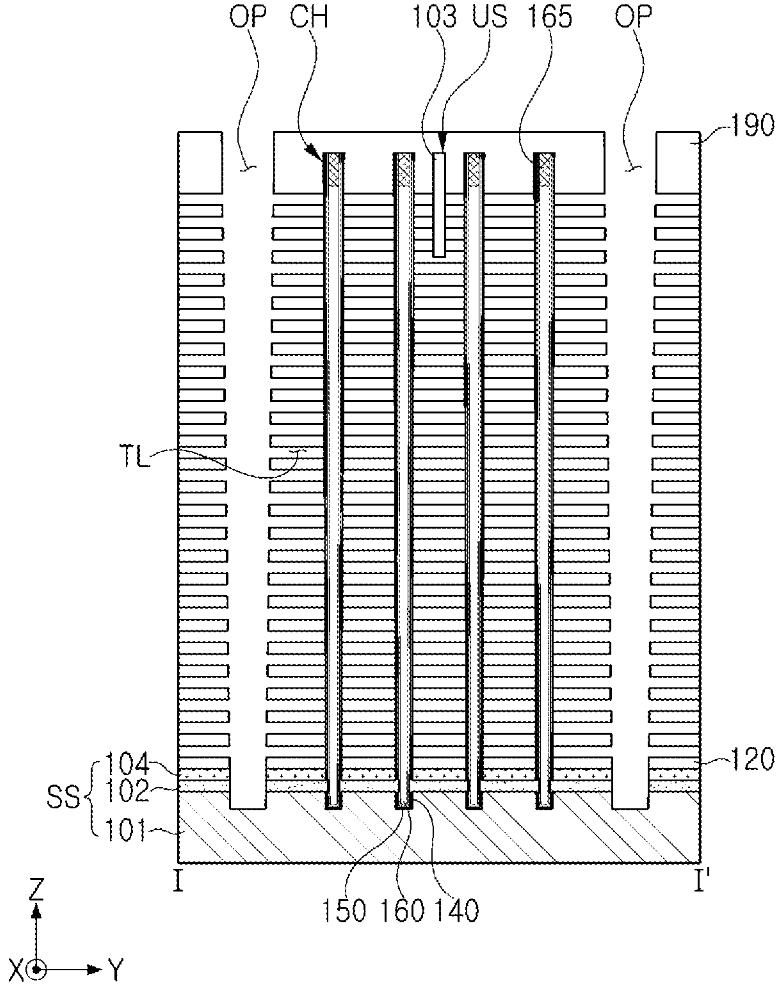

Referring to FIG. 11E, after the first horizontal conductive layer 102 is formed, the sacrificial insulating layers 118 may be removed to form tunnel portions TL.

First, after the first horizontal conductive layer 102 is formed by depositing a conductive material in the horizontal tunnel portion HTL, the sacrificial spacer layers SP may be removed in the trenches OP.

Next, the sacrificial insulating layers 118 may be selectively removed with respect to the interlayer insulating layers 120 using, for example, wet etching. Accordingly, a plurality of tunnel portions TL may be formed between the interlayer insulating layers 120.

Figure 11F:
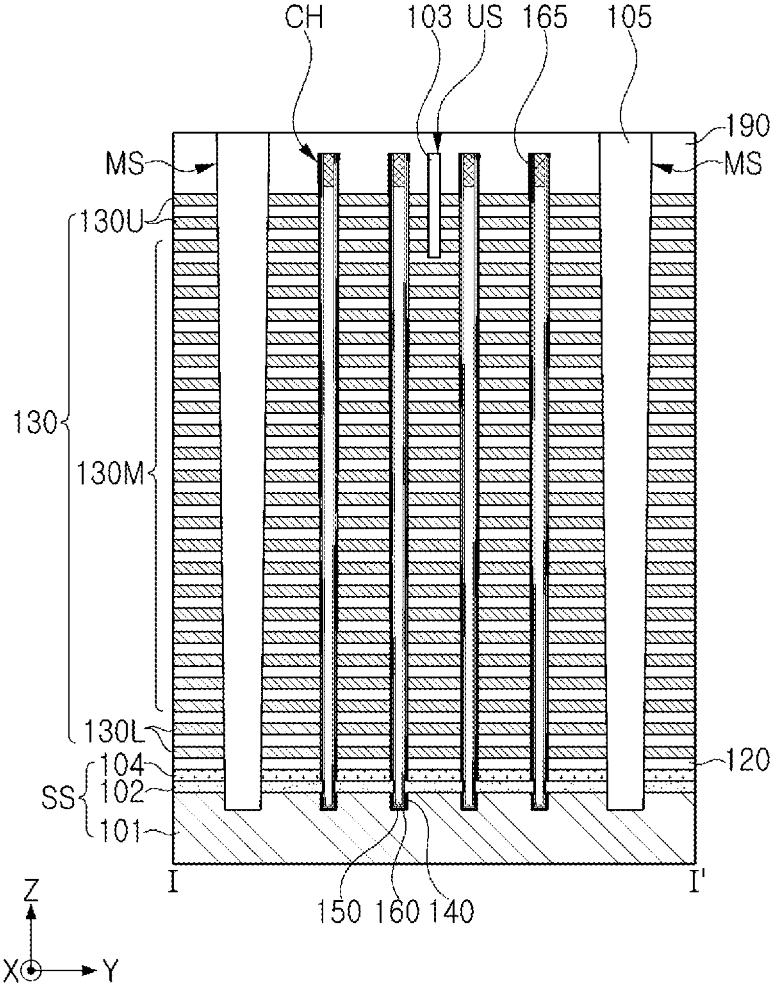

Referring to FIG. 11F, the gate electrodes 130 may be formed by filling the tunnel portions TL with a conductive material, and the separation regions MS may be formed.

The conductive material forming the gate electrodes 130 may be in (e.g., may fill) the tunnel portions TL. The conductive material may include a metal, polycrystalline silicon, or a metal silicide material. After the gate electrodes 130 are formed, the separation regions MS may be formed by removing the conductive material deposited in the trenches OP through an additional process and then forming the separation insulating layer 105. When the conductive material is removed, portions of the gate electrodes 130 may be removed from the trenches OP. In this case, the separation insulating layer 105 may include regions partially horizontally extending from the trenches OP to the side surfaces of the gate electrodes 130.

In the case of the example embodiments of FIGS. 4B and 4C, the horizontal blocking layers 141 may be first formed in the tunnel portions TL before the gate electrodes 130 are formed in this operation, thereby manufacturing the gate electrodes 130.

Next, referring to FIG. 2, contact plugs 170 passing through the cell area insulating layer 190 to be electrically connected to the channel structures CH may be formed, and interconnection lines 180 may be formed, thereby manufacturing the semiconductor device 100.

Figure 12:
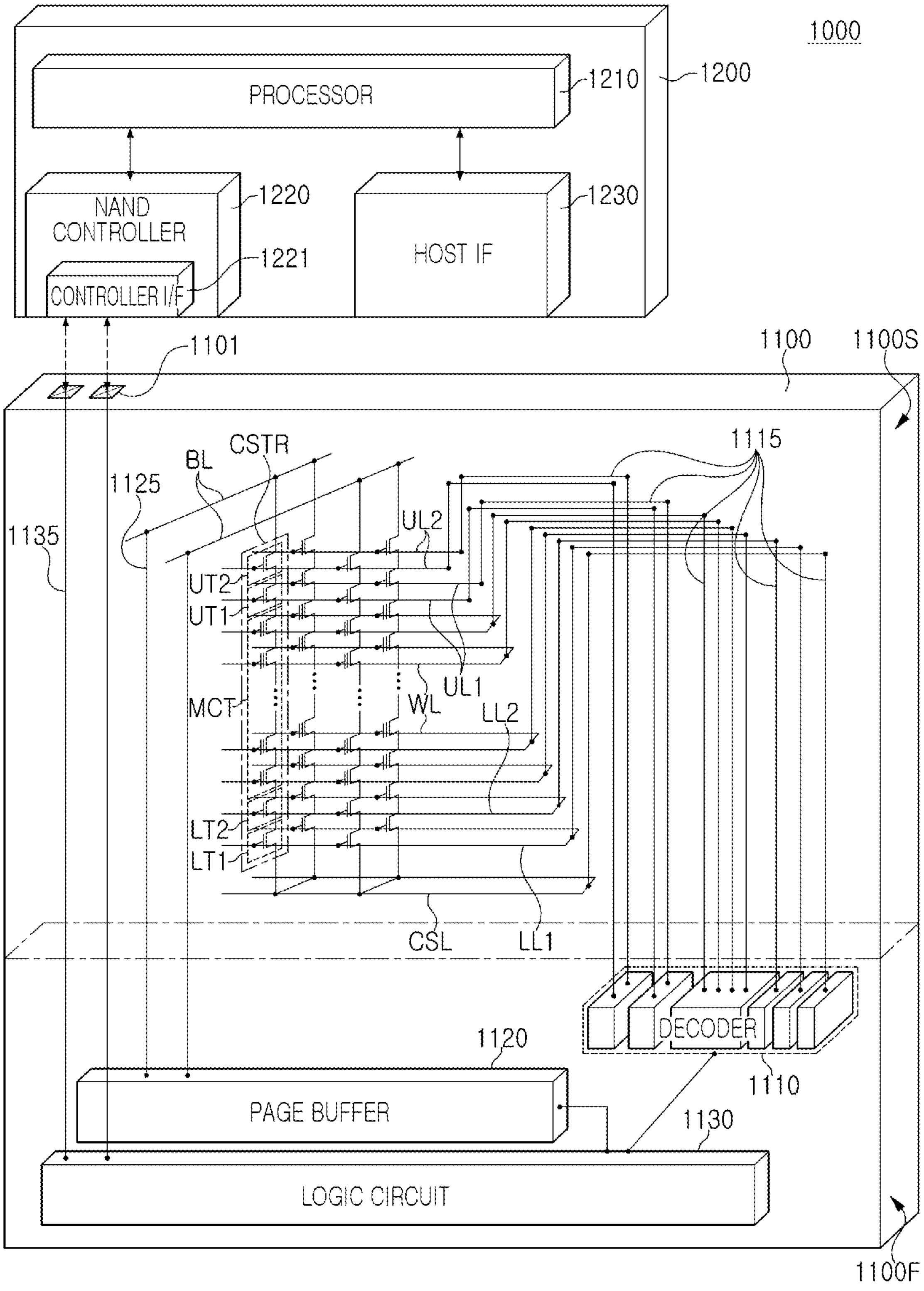
FIG. 12 is a diagram schematically illustrating a data storage system including a semiconductor device according to example embodiments.

FIG. 12 is a diagram schematically illustrating a data storage system including a semiconductor device according to example embodiments.

Referring to FIG. 12, a data storage system 1000 may include a semiconductor device 1100 and a controller 1200 electrically connected to the semiconductor device 1100. The data storage system 1000 may be a storage device including one or a plurality of semiconductor devices 1100 or may be an electronic device including a storage device. For example, the data storage system 1000 may be a solid state drive (SSD) device, a universal serial bus (USB), a computing system, a medical device, or a communication device, including one or a plurality of semiconductor devices 1100.

The semiconductor device 1100 may be a nonvolatile memory device, for example, the NAND flash memory device described above with reference to FIGS. 1 to 8. The semiconductor device 1100 may include a first semiconductor structure 1100F and a second semiconductor structure 1100S on the first semiconductor structure 1100F. In example embodiments, the first semiconductor structure 1100F may be disposed next to the second semiconductor structure 1100S. The first semiconductor structure 1100F may be a peripheral circuit structure including a decoder circuit 1110, a page buffer 1120, and a logic circuit 1130. The second semiconductor structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second semiconductor structure 1100S, each of the memory cell strings CSTR includes lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously modified depending on example embodiments.

In example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT2 may be used in an erase operation for erasing data stored in the memory cell transistors MCT using the GIDL phenomenon.

The common source line CSL, the first and second lower gate lines LL1 and LL2, the word lines WL, and the first and second upper gate lines UL1 and UL2 may be electrically connected to the decoder circuit 1110 through first connection wires 1115 extending from the inside of the first semiconductor structure 1100F to the second semiconductor structure 1100S. The bit lines BL may be electrically connected to the page buffer 1120 through second connection lines 1125 extending from the inside of the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through the input/output pad 1101 electrically connected to the logic circuit 1130. The input/output pad 1101 may be electrically connected to the logic circuit 1130 through an input/output connection line 1135 extending from the inside of the first semiconductor structure 1100F to the second semiconductor structure 1100S.

The controller 1200 may include a processor 1210, a NAND controller 1220, and a host interface (IF) 1230. In some embodiments, the data storage system 1000 may include a plurality of semiconductor devices 1100, and in this case, the controller 1200 may control the plurality of semiconductor devices 1100.

The processor 1210 may control the overall operation of the data storage system 1000 including the controller 1200. The processor 1210 may operate according to a predetermined firmware, and may access the semiconductor device 1100 by controlling the NAND controller 1220. The NAND controller 1220 may include a controller interface (I/F) 1221 that handles communication with the semiconductor device 1100. Through the controller interface 1221, a control command for controlling the semiconductor device 1100, data to be written to the memory cell transistors MCT of the semiconductor device 1100, data to be read from the memory cell transistors MCT of the semiconductor device 1100, and the like may be transmitted. The host interface 1230 may provide a communication function between the data storage system 1000 and an external host. When receiving a control command from an external host through the host interface 1230, the processor 1210 may control the semiconductor device 1100 in response to the control command.

Figure 13:
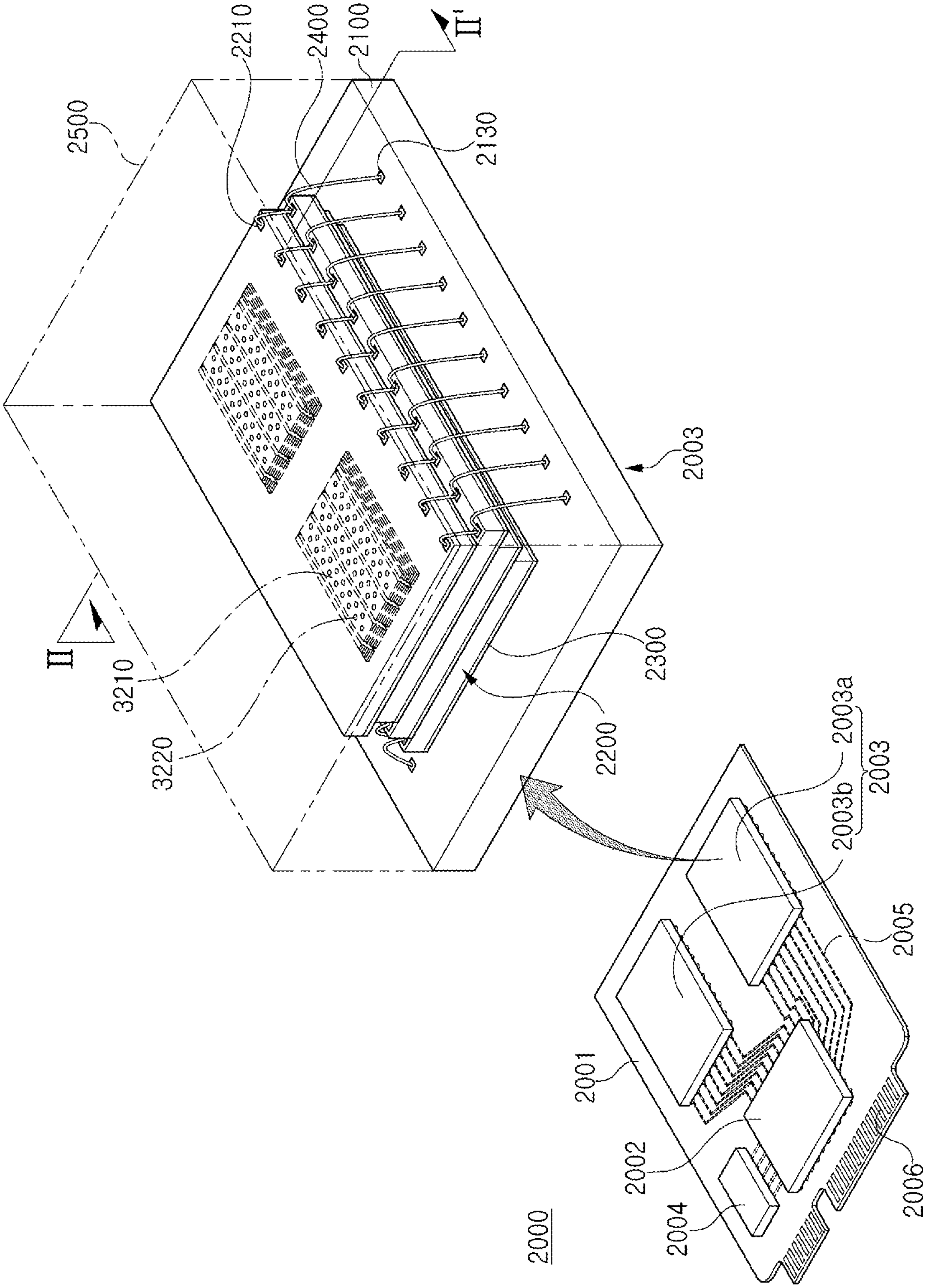
FIG. 13 is a schematic perspective view of a data storage system including a semiconductor device according to an example embodiment.

FIG. 13 is a schematic perspective view of a data storage system including a semiconductor device according to an example embodiment.

Referring to FIG. 13, a data storage system 2000 according to an example embodiment of the present inventive concept may include a main board 2001, a controller 2002 mounted on the main board 2001, one or more semiconductor packages 2003, and a DRAM 2004. The semiconductor package 2003 and the DRAM 2004 may be electrically connected to the controller 2002 by wiring patterns 2005 formed on the main board 2001.

The main board 2001 may include a connector 2006 including a plurality of pins coupled to an external host. The number and arrangement of the plurality of pins in the connector 2006 may vary according to a communication interface between the data storage system 2000 and the external host. In example embodiments, the data storage system 2000 may communicate with an external host according to any one of the interfaces such as a Universal Serial Bus (USB), Peripheral Component Interconnect Express (PCI-Express), Serial Advanced Technology Attachment (SATA), an M-Phy for Universal Flash Storage (UFS), or the like. In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to or read data from the semiconductor package 2003, and may improve the operating speed of the data storage system 2000.

The DRAM 2004 may be a buffer memory for reducing a speed difference between the semiconductor package 2003 as a data storage space and an external host. The DRAM 2004 included in the data storage system 2000 may operate as a kind of cache memory, and may provide a space for temporarily storing data in a control operation for the semiconductor package 2003. When the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include the package substrate 2100, the semiconductor chips 2200 on the package substrate 2100, adhesive layers 2300 disposed on lower surfaces of the semiconductor chips 2200, respectively, a connection structure 2400 electrically connecting the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each semiconductor chip 2200 may include an input/output pad 2210. The input/output pad 2210 may correspond to the input/output pad 1101 of FIG. 12. Each of the semiconductor chips 2200 may include gate stack structures 3210 and channel structures 3220. Each of the semiconductor chips 2200 may include the semiconductor device described above with reference to FIGS. 1 to 8.

In example embodiments, the connection structure 2400 may be a bonding wire electrically connecting the input/output pad 2210 and the package upper pads 2130. Accordingly, in each of the first and second semiconductor packages 2003*a* and 2003*b*, the semiconductor chips 2200 may be electrically connected to each other by a bonding wire method, and may be electrically connected to the upper package pads 2130 of the package substrate 2100. According to example embodiments, in each of the first and second semiconductor packages 2003*a* and 2003*b*, the semiconductor chips 2200 may be electrically connected to each other by a connection structure including a through-electrode (TSV) instead of the bonding wire-type connection structure 2400.

In example embodiments, the controller 2002 and the semiconductor chips 2200 may be included in one package. In an example embodiment, the controller 2002 and the semiconductor chips 2200 are mounted on a separate interposer substrate different from the main substrate 2001, and the controller 2002 and the semiconductor chips 2200 may be electrically connected to each other by wiring formed on the interposer substrate.

Figure 14:
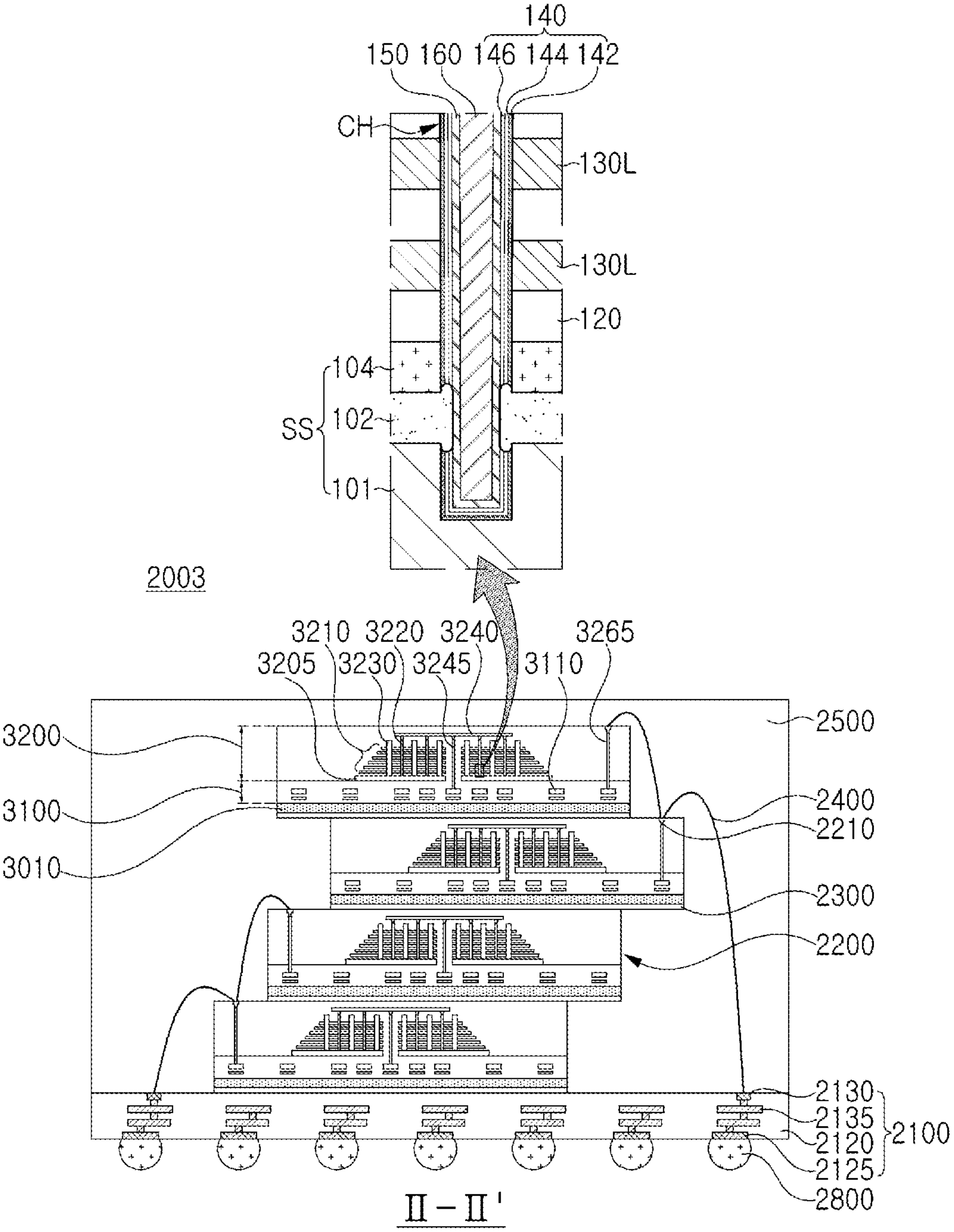
FIG. 14 is a cross-sectional view schematically illustrating a semiconductor package according to an example embodiment.

FIG. 14 is a cross-sectional view schematically illustrating a semiconductor package according to an example embodiment. FIG. 14 illustrates an example embodiment of the semiconductor package 2003 of FIG. 13, and conceptually illustrates a region taken along line II-II' of the semiconductor package 2003 of FIG. 13.

Referring to FIG. 14, in a semiconductor package 2003, the package substrate 2100 may be a printed circuit board. The package substrate 2100 may include a package substrate body 2120, upper package pads 2130 (refer to FIG. 13) disposed on the upper surface of the package substrate body 2120, lower pads 2125 disposed on or exposed through the lower surface of the package substrate body 2120, and internal wirings 2135 electrically connecting the upper pads 2130 and the lower pads 2125 inside the package substrate body 2120. The upper pads 2130 may be electrically connected to the connection structures 2400. The lower pads 2125 may be electrically connected to the wiring patterns 2005 of the main board 2010 of the data storage system 2000 as illustrated in FIG. 13 through conductive connectors 2800.

Each of the semiconductor chips 2200 may include a semiconductor substrate 3010 and a first semiconductor structure 3100 and a second semiconductor structure 3200 that are sequentially stacked on the semiconductor substrate 3010. The first semiconductor structure 3100 may include a peripheral circuit area including peripheral wirings 3110. The second semiconductor structure 3200 may include a common source line 3205, a gate stack structure 3210 on the common source line 3205, channel structures 3220 and separation regions 3230 passing through the gate stack structure 3210, bit lines 3240 electrically connected to the memory channel structures 3220, and cell contact plugs electrically connected to the word lines WL (refer to FIG. 12) of the gate stack structure 3210. As described above with reference to FIGS. 1 to 8, the gate stack layer 140 in the channel structure CH in each of the semiconductor chips 2200 may include a dielectric layer 142 including a ferroelectric material, the channel layer 150 may include an oxide semiconductor material, and the buried semiconductor layer 160 may include silicon (Si).

Each of the semiconductor chips 2200 may include a through wiring 3245 electrically connected to the peripheral wirings 3110 of the first semiconductor structure 3100 and extending into the second semiconductor structure 3200. The through wiring 3245 may be disposed outside the gate stack structure 3210, or may pass through the gate stack structure 3210. Each of the semiconductor chips 2200 may further include an input/output connection wiring 3265 electrically connected to the peripheral wirings 3110 of the first semiconductor structure 3100 and extending into the second semiconductor structure 3200, and an input/output pad 2210 (refer to FIG. 13) electrically connected to the input/output connection wiring 3265.

As set forth above, according to an example embodiment, by improving/optimizing a structure of a channel structure and an erase voltage application method, a semiconductor device having improved integration and electrical characteristics and a data storage system including the same may be provided.

While example embodiments have been illustrated and described above, it will be apparent to those skilled in the art that modifications and variations could be made without departing from the scope of the present inventive concept as defined by the appended claims.

What is claimed is:

1. A semiconductor device comprising:

a source structure;

gate electrodes spaced apart from each other and stacked in a first direction, perpendicular to an upper surface of the source structure; and a channel structure extending through the gate electrodes in the first direction, and including a dielectric layer, a charge storage layer, a tunneling layer, a channel layer, and a buried semiconductor layer, wherein the dielectric layer is between the gate electrodes and the charge storage layer, wherein the tunneling layer is between the charge storage layer and the channel layer, wherein the channel layer is between the tunneling layer and the buried semiconductor layer, wherein a side surface of a lower portion of the channel layer is in contact with the source structure, wherein the dielectric layer is continuous between the gate electrodes and includes a ferroelectric material, the channel layer includes an oxide semiconductor material, and the buried semiconductor layer includes a semiconductor material including silicon (Si), wherein the channel layer includes a material different from a material of the buried semiconductor layer, and wherein the buried semiconductor layer is disposed in a channel hole to fill an inner space of the channel layer.

2. The semiconductor device of claim 1, wherein the channel structure further includes a channel pad in an upper portion of the channel structure and in contact with the channel layer.

3. The semiconductor device of claim 2, wherein in the channel structure, the dielectric layer, the charge storage layer, the tunneling layer, and the channel layer extend to an upper end of the channel structure, and the channel layer is between the channel pad and the tunneling layer in the upper portion of the channel structure.

4. The semiconductor device of claim 1, wherein the channel layer includes zinc tin oxide (ZTO), indium zinc oxide (IZO), ZnO, indium gallium zinc oxide (IGZO), indium gallium silicon oxide (IGSO), indium oxide (InO), tin oxide (SnO), titanium oxide (TiO), Zinc Oxynitride (ZnON), Magnesium Zinc Oxide (MgZnO), Zirconium Indium Zinc Oxide (ZrInZnO), Hafnium Indium Zinc Oxide (HfInZnO), Tin Indium Zinc Oxide (SnInZnO), aluminum tin indium zinc oxide (AlSnInZnO), silicon indium zinc oxide (SiInZnO), aluminum zinc tin oxide (AlZnSnO), gallium zinc tin oxide (GaZnSnO), or zirconium zinc tin oxide (ZrZnSnO).

5. The semiconductor device of claim 1, wherein the dielectric layer includes hafnium (Hf), zirconium (Zr), silicon (Si), yttrium (Y), aluminum (Al), gadolinium (Gd), strontium (Sr), lanthanum (La), or titanium (Ti), or an oxide thereof.

6. The semiconductor device of claim 1, wherein the buried semiconductor layer includes polycrystalline silicon.

7. The semiconductor device of claim 1, wherein the channel structure further includes a blocking layer between the dielectric layer and the charge storage layer.

8. The semiconductor device of claim 7, wherein the blocking layer includes silicon oxide (SiO), silicon nitride (SiN), silicon oxynitride (SiON), or a high-k dielectric material.

9. The semiconductor device of claim 1, wherein the channel structure further includes a horizontal blocking layer between the gate electrodes and the dielectric layer and extending horizontally along upper surfaces and lower surfaces of the gate electrodes.

10. The semiconductor device of claim 1, wherein the channel structure is configured to have an erase voltage applied thereto through the source structure, and wherein, after the erase voltage reaches a target voltage level during an erase operation, the channel structure is configured to have a step voltage applied thereto through the source structure such that the erase voltage has a voltage higher than the target voltage level.

11. The semiconductor device of claim 10, wherein the step voltage corresponds to a voltage caused by ferroelectric polarization by the dielectric layer.

12. The semiconductor device of claim 10, wherein an erase verify operation is performed after the erase voltage reaches the target voltage level and is not performed after the step voltage is applied.

13. The semiconductor device of claim 1, further comprising circuit elements below the source structure and electrically connected to the gate electrodes and the channel structure.

14. A semiconductor device comprising:

a source structure including a conductive plate layer and a source layer including a semiconductor material on the conductive plate layer;

gate electrodes spaced apart from each other and stacked in a first direction, perpendicular to an upper surface of the source structure; and a channel structure extending through the gate electrodes in the first direction, and including a dielectric layer, a charge storage layer, a tunneling layer, a channel layer, and a buried semiconductor layer, wherein the dielectric layer is between the gate electrodes and the charge storage layer, wherein the tunneling layer is between the charge storage layer and the channel layer, wherein the channel layer is between the tunneling layer and the buried semiconductor layer, wherein the channel structure has a contact region in which the dielectric layer, the charge storage layer, and the tunneling layer are absent in a lower portion of the channel structure, and a side surface of the channel layer is in contact with the source layer in the contact region, wherein the channel layer includes an oxide semiconductor material, and wherein the dielectric layer is continuous between the gate electrodes and includes a ferroelectric material, wherein the buried semiconductor layer includes a semiconductor material wherein the channel layer includes a material different from a material of the buried semiconductor layer, and wherein the buried semiconductor layer is disposed in a channel hole to fill an inner space of the channel layer.

15. The semiconductor device of claim 14, wherein the channel structure is configured to have an erase voltage applied thereto through the source structure, and wherein, after the erase voltage reaches a target voltage level during an erase operation, the channel structure is configured to have a step voltage applied thereto through the source structure such that the erase voltage has a voltage higher than the target voltage level.

16. The semiconductor device of claim 14, wherein the dielectric layer includes a ferroelectric material or an anti-ferroelectric material.

17. The semiconductor device of claim 14, wherein an entire outer surface of the buried semiconductor layer is surrounded by the channel layer.

18. A data storage system comprising:

a semiconductor storage device including a source structure, circuit elements on a side of the source structure, and an input/output pad electrically connected to the circuit elements; and a controller electrically connected to the semiconductor storage device through the input/output pad and configured to control the semiconductor storage device, wherein the semiconductor storage device further includes:

gate electrodes spaced apart from each other and stacked in a first direction, perpendicular to an upper surface of the source structure; and a channel structure extending through the gate electrodes in the first direction, and including a dielectric layer, a charge storage layer, a tunneling layer, a channel layer, and a buried semiconductor layer, wherein the dielectric layer is between the gate electrodes and the charge storage layer, wherein the tunneling layer is between the charge storage layer and the channel layer, wherein the channel layer is between the tunneling layer and the buried semiconductor layer, wherein a side surface of a lower portion of the channel layer is in contact with the source structure, wherein the dielectric layer is continuous between the gate electrodes and includes a ferroelectric material, the channel layer includes an oxide semiconductor material, and the buried semiconductor layer includes a semiconductor material including silicon (Si), wherein the channel layer includes a material different from a material of the buried semiconductor layer, and wherein the buried semiconductor layer is disposed in a channel hole to fill an inner space of the channel layer.

19. The data storage system of claim 18, wherein the channel structure further includes a blocking layer between the dielectric layer and the charge storage layer, or between the gate electrodes and the dielectric layer.

* * * * *